United States Patent
Matthies (12)

(10) Patent No.: US 6,498,592 B1
(45) Date of Patent: Dec. 24, 2002

(54) DISPLAY TILE STRUCTURE USING ORGANIC LIGHT EMITTING MATERIALS

(75) Inventor: Dennis Lee Matthies, Princeton, NJ (US)

(73) Assignee: Sarnoff Corp., Princeton, NJ (US)

( * ) Notice: Subject to any disclaimer, the term of this patent is extended or adjusted under 35 U.S.C. 154(b) by 74 days.

(21) Appl. No.: 09/709,904

(22) Filed: Nov. 10, 2000

Related U.S. Application Data

(63) Continuation-in-part of application No. 09/250,324, filed on Feb. 16, 1999.

(51) Int. Cl.$^7$ .................................................. G09G 5/00
(52) U.S. Cl. ........................... 345/1.1; 345/36; 345/55; 345/76; 345/77; 345/84; 345/87; 345/100; 349/73; 349/74; 349/153
(58) Field of Search ............................. 345/1.1, 36, 55, 345/76, 77, 84, 87, 100; 349/73, 74, 153

(56) References Cited

U.S. PATENT DOCUMENTS

| | | |
|---|---|---|
| 3,828,215 A | 8/1974 | Bilsback |
| 3,855,499 A | 12/1974 | Yamada et al. |
| 4,006,383 A | 2/1977 | Luo et al. |
| 4,155,030 A | 5/1979 | Chang |
| 4,206,460 A | 6/1980 | Yasuda et al. |
| 4,266,223 A | 5/1981 | Frame |
| 4,368,467 A | 1/1983 | Unotoro et al. |
| 4,471,263 A | 9/1984 | Harvey |
| 4,508,990 A | 4/1985 | Essinger |
| 4,528,480 A | 7/1985 | Unagami et al. |
| 4,554,485 A | 11/1985 | Yamada |
| 4,603,280 A | 7/1986 | Pankove |
| 4,613,793 A | 9/1986 | Panicker et al. |
| 4,713,579 A | 12/1987 | Miura |
| 4,757,235 A | 7/1988 | Nunomura et al. |
| 4,792,500 A | 12/1988 | Kojima |
| 4,818,914 A | 4/1989 | Brodie |
| 4,843,280 A | 6/1989 | Lumbard et al. |
| 4,908,539 A | 3/1990 | Meyer |
| 5,075,595 A | 12/1991 | Kane |
| 5,095,248 A | 3/1992 | Sato |
| 5,099,301 A | 3/1992 | Kikinis |
| 5,153,483 A | 10/1992 | Kishino et al. |
| 5,156,924 A | 10/1992 | Taniguchi et al. |
| 5,179,316 A | 1/1993 | Kellam |
| 5,206,749 A | 4/1993 | Zavracky et al. |
| 5,256,469 A | 10/1993 | Cherukuri et al. |
| 5,260,698 A | 11/1993 | Munetsugu et al. |
| 5,277,724 A | 1/1994 | Prabhu |
| 5,281,805 A | 1/1994 | Sauer |
| 5,283,500 A | 2/1994 | Kochanski |
| 5,302,966 A | 4/1994 | Stewart |
| 5,317,236 A | 5/1994 | Zavracky et al. |
| 5,336,879 A | 8/1994 | Sauer |
| 5,347,201 A | 9/1994 | Liang et al. |

(List continued on next page.)

Primary Examiner—Bipin Shalwala
Assistant Examiner—Vincent E. Kovalick
(74) Attorney, Agent, or Firm—W. J. Burke

(57) ABSTRACT

A tiled display structure is fabricated on a single substrate that also serves as a circuit board containing electronic components. Electrodes are formed on the substrate and the remainder of the display section is formed on the electrodes. The pixel elements use patterned display material, and occupy only a portion of the pixel structure. The electronic components are mounted on the substrate using exceptionally long leads to assist in thermal management of tiles. Alternatively, each tile includes a fin structure on the circuit board surface onto which electronic components are mounted and are not in contact with the substrate. Alternatively, each tile includes a flexible circuit board mounted on the substrate, a portion of which is bent away from the substrate. Electronic components are coupled to this portion of the flexible circuit boards such that the components are not in contact with the substrate to assist in thermal management.

41 Claims, 8 Drawing Sheets

U.S. PATENT DOCUMENTS

| | | |
|---|---|---|
| 5,347,292 A | 9/1994 | Ge et al. |
| 5,371,434 A | 12/1994 | Rawlings |
| 5,378,963 A | 1/1995 | Ikeda |
| 5,384,517 A | 1/1995 | Uno |
| 5,402,041 A | 3/1995 | Kishino et al. |
| 5,534,743 A | 7/1996 | Jones et al. |
| 5,644,327 A * | 7/1997 | Onyskevych et al. ....... 313/503 |
| 5,661,531 A | 8/1997 | Greene et al. |
| 5,668,569 A | 9/1997 | Greene et al. |
| 5,694,155 A * | 12/1997 | Stapleton et al. ........... 345/204 |
| 5,703,394 A * | 12/1997 | Wei et al. .................... 257/431 |
| 5,739,545 A | 4/1998 | Guha et al. |
| 5,739,800 A | 4/1998 | Lebby et al. |
| 5,745,093 A | 4/1998 | Tsuzuki et al. |
| 5,764,209 A | 6/1998 | Hawthorne et al. |
| 5,771,039 A | 6/1998 | Ditzik |
| 5,796,375 A * | 8/1998 | Holloman ................... 345/74.1 |
| 5,805,117 A * | 9/1998 | Mazurek et al. ............ 248/919 |
| 5,818,404 A | 10/1998 | Lebby et al. |
| 5,847,783 A * | 12/1998 | Hiramoto et al. ........... 345/102 |
| 5,867,236 A | 2/1999 | Babuka et al. |
| 5,989,945 A * | 11/1999 | Yudasaka et al. ............ 257/347 |
| 6,005,649 A * | 12/1999 | Krusius et al. ................ 349/20 |
| 6,057,898 A * | 5/2000 | Itoh et al. .................... 349/153 |
| 6,100,861 A * | 8/2000 | Cohen et al. ................. 345/88 |
| 6,314,483 B1 * | 11/2001 | Goto et al. .................. 361/683 |
| 6,339,414 B1 * | 1/2002 | Todokoro et al. ........... 345/75.1 |

* cited by examiner

DISPLAY TILE STRUCTURE USING ORGANIC LIGHT EMITTING MATERIALS

This patent application is a Continuation-in-Part of U.S. patent application Ser. No. 09/250,324, filed Feb. 16, 1999, which is incorporated herein by reference in its entirety.

BACKGROUND OF THE INVENTION

The present invention concerns electronic display devices and, in particular, large-area display devices which are formed as an array of tiled display devices.

There is an unmet need for large-area flat displays. No clear solution is apparent in the market place. This unmet need is becoming increasingly critical as the advancement of information results in increasing amounts of data to be displayed. A solution for large-area displays is needed to serve as the human interface for conveying information from sensors, computers, databases, cameras etc. in this information dominated age. Many critical applications demand large-area displays, these include:

- Home theater applications
- Applications that require multiple viewers
- Applications in which the user needs to move about in an area
- Applications where simulation of the real world is needed for training.

The requirements for each application differ in size, shape, total number of picture elements (pixels), and brightness. Requirements that are common to most applications include, a relatively large number of pixels, color, ruggedness, portability (minimum thickness and weight), reliability, low power, and affordable cost. A good display solution does not exist for these needs using present technology.

There are fundamental technical issues that impose scaling-laws and limit the complexity and size of displays that can be manufactured. These fundamental limitations are one reason why a technical solution that meets the need for large-area displays has not been achieved.

One measure of the complexity of a display device is its total number of pixels. The evolution of display technology has made newer and more complex pixel formats possible— such as VGA, SVGA, XGA, and SXGA. Increased complexity typically is accompanied by added costs. The underlying cause of this empirical complexity law is yield losses caused by random material or particle defects. These defects cause manufacturing yields to diminish as the number of pixels in the display increases.

One measure of the size of the display is its area. Costs increase exponentially with size. Each technology, LCD, PDP, EL, etc., has its own limit on maximum size. The underlying technical cause of this empirical relationship is tolerance. It is desirable to hold tight tolerances in manufacturing displays because, as the size increases, the effects of thermal expansion, humidity, residual stresses, and physical sag become more important.

Building a large-area display out of smaller tiles has been recognized as a desirable solution. Tiling is an approach that provides great flexibility for size and shape. Tiling is not subject to many of the problems that limit the size of monolithic display technologies. The complexity law does not apply because, depending on the size of the tile, the basic unit of manufacture in tiled displays is less complex than a large, monolithic multi-pixel display. The size law is not a limiting factor because the basic unit of manufacture is relatively small. Tiled displays obey a scaling-law which is not exponential but linear with display area. This fundamentally different scaling behavior is one advantage of tile technology. It makes these displays possible and reduces manufacturing costs.

No practical tiled display system has yet been developed (video walls formed by abutting conventional CRT displays are not considered tiled because of their wide separations between adjacent displays). What has been missing is a fabrication technology that allows a display to be constructed so that pixels can be brought up to the very edge (actually, within ½ pixel spacing period of the edge), while at the same time allowing for electronics to address each tile, even those tiles completely surrounded by other tiles. Two barriers to implementing the tiled approach have been: 1) eliminating the visibility of the seams between tiles, and 2) providing electrical access to the pixels.

One type of tiled display is disclosed in U.S. Pat. No. 5,644,327 entitled TESSELLATED ELECTROLUMINESCENT DISPLAY HAVING A MULTILAYER CERAMIC SUBSTRATE to Onyskevych et al., which is incorporated herein by reference for its teaching on tiled displays. This patent describes an electroluminescent display and a combination field emissive and electroluminescent display which are formed as tiles that may be joined together to provide a large-area display device. The exemplary tiles are formed using low-temperature co-fired ceramic and metal (LTCCM) structures consisting of multiple layers of ceramic circuit-board material laminated to a metal core.

Driving circuitry for the displays is mounted on the back of the structures and vias are passed through the structure from the back to the front in order to make connection with the pixel electrodes on the front of the display device. In addition, connections are made on a pixel-by-pixel basis or for a small group of pixels. Thus, a display device according to the referenced patent may need a relatively large number of vias. The described tiles include connectors at their edges through which multiple tiles may be interconnected.

SUMMARY OF THE INVENTION

The present invention is embodied in an improved tiled display structure. According to one aspect of the invention, tiles of the display are fabricated on a single substrate.

According to another aspect of the invention, electronic components are coupled to circuit boards using exceptionally long leads to assist in thermal management of tiles.

According to another aspect of the invention, each tile includes a fin structure on the circuit board surface of its substrate. Electronic components are coupled to these fin structures to assist in thermal management.

According to yet another aspect of the invention, each tile includes a flexible circuit board on the circuit board side of its substrate. Electronic components are coupled to these flexible circuit boards to assist in thermal management.

DETAILED DESCRIPTION

Figure 1:
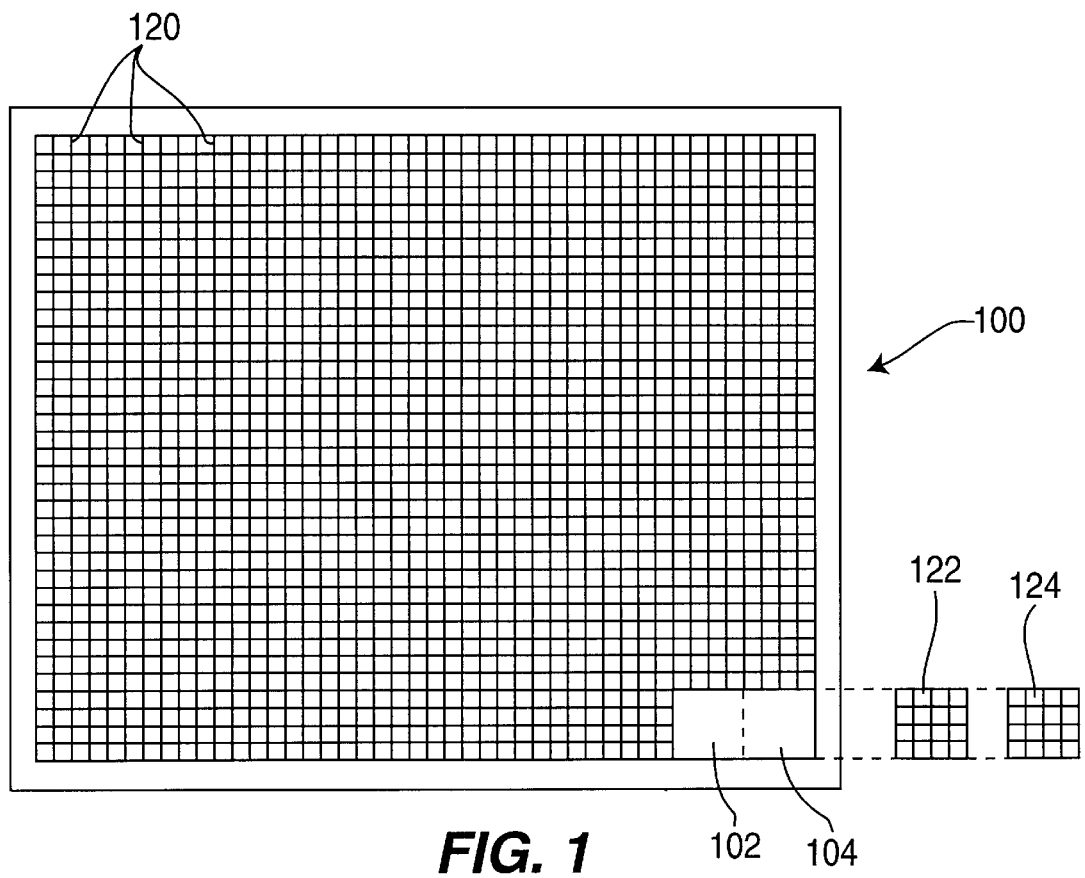
FIG. 1 is a front plan drawing of a large area display device from which two tiles have been removed.

The invention is described in terms of exemplary embodiments which are illustrated in the drawing figures. The drawing figures are not to scale. Indeed, dimensions of the drawing figures are exaggerated to aid in the description of the invention. Although the invention is described in terms of an optical light emitting diode (OLED) display device, it is contemplated that it may be practiced with other emissive display technologies such as electroluminescent, light emitting diode (LED) or plasma technology; or with reflective display technologies such as Bistable, Reflective Cholesteric (BRC) liquid crystal technology.

FIG. 1 is a front plan view of a partially assembled large-area display 100 according to the present invention. The display 100 is a tiled display in which emissive or reflective elements, on which the image pixels are formed, are built as relatively small arrays on tiles 120 and assembled into a frame to produce the large-area display having a large number of pixel forming elements. Alternatively, the tiles may be assembled side-to-side with their pixels aligned in rows and columns without a frame. In this instance, the individual tiles may be held together by mullions.

The tiles are constructed with pixel forming elements evenly spaced up to the edges of the tiles. As described below with reference to FIGS. 8 through 13, the tiles are formed such that, when they are joined, the inter-pixel distance between the edge pixels of two adjacent tiles is the same as the inter-pixel distance of adjacent pixels in the interior of a tile. The display shown in FIG. 1 is missing two tiles 122 and 124. These tiles are inserted into the positions 102 and 104 to complete the display.

Although the display 100 is shown as being formed from tiles having 16 pixel forming elements in a four by four array, it is contemplated that each tile may include many more pixels. In one exemplary embodiment of the invention, described below, each tile includes 6400 pixel forming elements arranged as a 80 by 80 matrix. These tile sizes are only exemplary. It is contemplated that each tile may include more or fewer pixel forming elements. In addition, it is contemplated that a single display may be formed from tiles having different numbers of pixel forming elements. For example, a display may have tiles with relatively large numbers of pixel forming elements near the center and tiles having relatively small numbers of pixel forming elements near the edges.

Figure 1A:
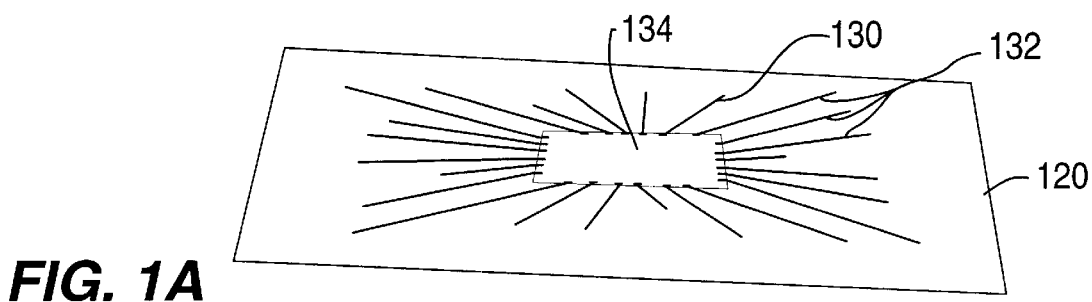
FIG. 1A is a perspective drawing of the back side of a tile suitable for use in the large area display shown in FIG. 1.
Figure 1B:
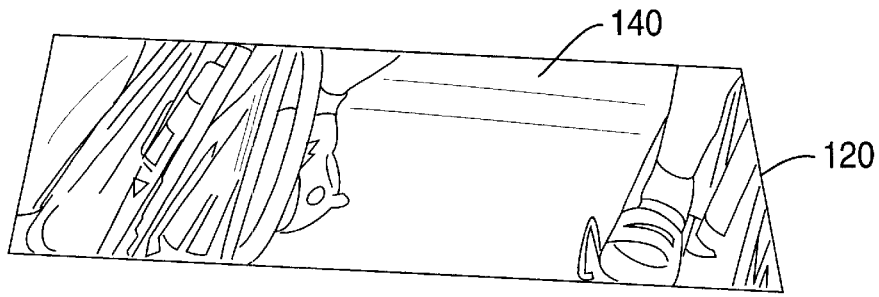
FIG. 1B is a perspective drawing of the front side of a tile suitable for use in the large area display shown in FIG. 1.

FIGS. 1A and 1B are perspective drawings showing the back and front surfaces of an exemplary tile 120. As shown in FIG. 1A, the tile includes a circuit board 130 on which is mounted at least one integrated circuit 134. The integrated circuit is connected to the pixel forming elements through conductive traces 132 on the circuit board which are coupled to vias (not shown) that extend through the circuit board to make contact with the row or column electrodes of the display device. In the tile shown in FIG. 1A, vias extend through the pixel forming elements internal to the display area, as described in U.S. patent application Ser. No. 09/250, 324. Alternatively, the vias may extend through pixel forming elements along two edges of the display, as described below with reference to FIGS. 3 through 4A.

In one exemplary embodiment of the invention, the pixel forming elements are made from an organic light emitting diode (OLED) material. The basic light emitting structure consists of a thin organic polymer layer sandwiched between a pair of appropriately selected and patterned electrodes. Current flowing from one electrode to the other electrode causes the organic polymer to emit light. At least one of the electrodes is desirably transparent to the emitted light. Indium tin-oxide (ITO) is the usual material used for this purpose. Conductive polymers such as polyaniline may also be used. OLED materials provide high brightness and high efficiency, and are relatively low cost materials.

An exemplary display structure according to the present invention is formed in two parts: a display section and an electronics section. These two parts are made separately and then joined to form a complete tile. The display section consists of a transparent glass layer on which transparent column electrodes are deposited. The active (i.e., light emitting) medium, an OLED material in this exemplary embodiment, is deposited onto this layer in a pattern of individual pixels, or subpixels. Row electrodes are deposited as the final display layer. Additional layers such as blocking or passivation layers may be present to improve the function or life of the display layers. The transparent electrode is preferably the hole-injecting electrode and the other electrode is preferably the electron-injecting electrode. The OLED materials between the electrodes are preferably conjugated polymer materials that are applied in the desired pixel pattern by thick film processes, however, small molecule materials can alternatively be applied by various thin film deposition techniques. The layers are patterned so that there is electrical access to each row and column at one or more points.

As an alternative to the OLED materials, the pixel forming elements of the tiles may be any of a number of emissive devices such as electroluminescent elements, light emitting diodes, field emissive elements, plasma elements or cathodoluminescent elements.

The electronics section is formed by punching or drilling vias through the circuit board and then printing or otherwise depositing the conductive traces on the circuit board. The conductive ink or paste used to form the conductive traces may also fill the vias. The vias make contact with the row and column electrodes of the display section when the electronics section and the display section are joined to form a tile.

Although it is not illustrated, another exemplary embodiment of the present invention includes a pixel forming structure that is appropriate for applications in which either a reflective or low power display is needed. The substrate and the electronics of this new structure are essentially the same as described below for the OLED embodiments. The display layer in this alternative embodiment, however, is a reflective display material. For example, a Bistable, Reflective Cholesteric (BRC) liquid crystal material which provides for a low power, bistable display. The disclosed tile structure enables, for the first time, video-rate displays in large area BRC displays. These materials switch between a planar, reflective state and a relatively transparent focal conic state. Utilizing a black backing, these two states may appear colored and black. The BRC materials offer distinct advantages for large area tiled displays: the operation between a reflecting and transparent state, combined with a black back-plane makes possible bright, high contrast displays under a variety of lighting conditions; and the bistability also allows for maintaining static images with no power applied.

One exemplary tile structure consists of a multilayer ceramic circuit board 132 that serves as a substrate upon which: the display material is mounted on the viewer side while the electronics 134 (active and passive) or drive or other functions are mounted mostly on the back side. Conductor elements 132 are printed on the individual layers to provide interconnections between the electronics and the display material, vias interconnect the con conductors in different layers; and connectors are provided on the back surface to connect to external power and signal sources. The tile structure may also have a structural layer(s) such as a high softening point metal or insulator to provide freedom from distortion during the processing of the ceramic materials, and/or thermal management during the operation of the display. The tile structure also contains a transparent layer (e.g. float glass) on the viewer surface to protect or contain the display material. A back panel structure is provided to mount the individual tiles and to provide electrical connection to the power and drive signals needed by each individual tile structure.

The Multilayer ceramic circuit board 130 may be formed of layers of ceramic material. The layers are first formed and processed to form vias, conductors, and other features and then assembled in a stack taking care to carefully align each layer with those layers adjacent to it. Ceramic material here is meant in the broadest sense to include ceramics, glass ceramics, glass, and other high temperature insulating materials, such as alumina. The multiple layers together with the connectors and vias provide the basic function of a circuit board upon which active and passive electrical devices and circuits can be placed.

The conductors 132 may be thin and/or thick film conductors formed by any of the standard processes including, for example plating, evaporation, sputtering, printing and laminating. The materials may be metals or organic conductors. The conductors may be patterned by processes that may include, for example, printing or photolithography. These conductor patterns are formed on the surfaces of the individual layers in the disclosed structure and connect to the vias to provide, according to the design of the device a means of interconnecting the electronics on and external to the disclosed structure to the display material.

Another class of conductors is used to interconnect the layers. These conductors are called vias. Via is used in the broadest sense and includes conductors that go through openings in the layers, including the substrate, and those that go around an edge of the layers. Vias that go through a layer can be formed, for example, by making a hole in the layer and filling that hole with a conductor. Alternatively, pre-formed physical conductors may be imbedded in the layer. Vias that go over the edge of the layers can be formed by physically placing a wire (round or flat), or array of wires, and wire bonding the ends to the surfaces to be interconnected. Alternatively they can be formed in place by plating or other fabrication process for thick or thin film conductors.

The circuit board may by formed from a single ceramic material. A single material ceramic circuit board may be quite rugged depending on the material selected. This type of circuit board provides a single expansion coefficient, but may exhibit some difficulties with thermal management. Several exemplary methods to overcome this performance issue are discussed below in reference to FIGS. 14 through 16.

In an alternative embodiment, a core layer may also be included in this structure. This layer serves as a substrate for the assembly and processing of the ceramic material. The core layer acts to eliminate horizontal shrinkage, establish a single coefficient of expansion for the multilayer system, and provide mechanical ruggedness to the multilayer assembly. If the layer is a good electrical conductor it may also provide RF shielding. If the layer is also a good thermal conductor, it contributes to the thermal management of the display. Conductive layers, however, present a special problem for via connections. Via connections through metal layers can be fabricated in several ways: filling the periphery of the hole with an insulating material before putting a metal conductor through the middle, or by putting the conductor only through the middle leaving space separating the conductor from the conductive metal core.

The electronics which form the image processing and pixel driving circuitry are mounted on the layers. Electronics are used in the broadest sense to include both active and passive devices, and both discrete devices mounted on the layers and devices formed in place by processes such as those now used to make active matrix circuits for displays on various high temperature substrates. While these electronics can be placed anywhere, the most convenient location is the back surface. This permits standard assembly and attachment equipment and processes to be used. In addition, the placing of active or passive devices on the intervening layers or viewer surface permits greater flexibility in the system design.

The display material is applied to the surface visible to the viewer. Because of the flexibility of the construction of the disclosed structure, different display materials can be used. In an exemplary structure the display material is covered by a transparent layer to protect and contain the display material. Although for individual pixels this layer may be the transparent electrodes, it is often desirable to couple an additional, substantially flat layer of transparent material, such as float glass, over the electrodes and display material.

The edges of the tiles are desirably carefully formed to ensure that the tiled display has no visible seams between the tiles. One criterion for the tiles is that the spacing between the pixels separated by the tile seam is the same as the spacing of pixels on the tile. To satisfy this criterion, the tile edges are desirably dimensionally precise. Furthermore, if the edges are also used for conductors or if mullions are used to join adjacent tiles, it is desirable to account for the thickness of these conductors or mullions in the design and placement of the tiles.

A back panel may be provided for the physical mounting and interconnection of the tiles to form a display. The mounting of the tiles is done such that there is continuity in the pixel spacing over the display. The shape of the tiles is most typically square or rectangular, however the shape can be any shape that can be tiled to form a larger display. Also, the tile is typically flat, but may be curved along one or both dimensions to form curved or domed displays. Curved or domed displays can also be made using flat tiles mounted on a curved or domed back panel. Tiles may be attached to the back panel either by permanent connection such as soldering or using connectors which allow the tiles to be plugged into the back panel. This latter method permits the repair and replacement of individual tiles. Different types of tiles may be attached to different areas of the back panel—for example, higher resolution areas may be placed in the center or other areas of the large display. In addition, different sized or different shaped tiles may be combined in a single display. For example, tiles near the edges of a large panel may be larger and have a lesser pixel density than tiles near the center of the panel.

The back panel may also provide the means for connecting the tiles to the operational power and data signals needed to operate the tile. Matching connectors may be provided on both the back side of the tile and the back panel to provide this connection. In the case of the data signal connections, optical connection may be used as an alternative to physical connection.

The electrical structure of the back panel provides for the distribution of power and signals to the tiles, and the electrical structure of the tiles provide for the addressing of the display pixels. Both levels of structure are described. The information needs of a tiled display increase with the size of the display as measured in total number of pixels. If the tile includes image data storage, a greater number of pixels on a tile translates to greater amounts of data stored on the tile and greater rates of information transfer. If the image data is not stored on the tile then extra structures are used to provide the data for display in a timely manner.

One advantage of the tiled display is that the scan electronics can be internal to the tile and the scan rate of any one tile is the same for a small display or for a large display. Including driving and timing circuitry on each tile may provide a method to ensure that the brightness and gray scale of the display do not degrade with increasing size. The tiled displays described in detail below have an architecture which connects the signals to the pixels without interrupting the continuity of the pixel spacing, even at the edges of the tiles. The disclosed tiled displays may also have signal processing circuitry which extracts the signal information for that tile from a broadcast information signal and transforms the extracted information into the signals needed to address the tile.

Additionally exemplary display tiles of the present invention may include a memory used to store image data.

In general, the front-to-back connections include at least one for each row of pixels and at least one for each column of pixels on the tile. An exemplary embodiment of the present invention utilizes 10–20 connections per column and 4–8 connections per row. Tiled displays have relatively few pixels so that the number of interconnects per tile is relatively small and the yield on individual tiles can be high. This is a significant advantage of tiled displays when compared to fabrication of large displays from single substrates. In general, the yield is a function of the number of pixels in the display device. The redundancy provided by adding more than one connection per row or column may further increase yield and reliability, and may also reduce line impedance for the rows and columns.

The connection to the row or column is made with a via that extends from the back surface of the tile. This via has a diameter less than the spacing of a pixel. To accomplish this, the portions of the vias in the display layer(s) may be made smaller than the vias through the other intervening layers, and, as described below, the connections may be staggered over the area of the tile to provide maximum spacing between the wider interconnects. These connections are a link in the distribution of the display signals to the pixels.

Figure 2:
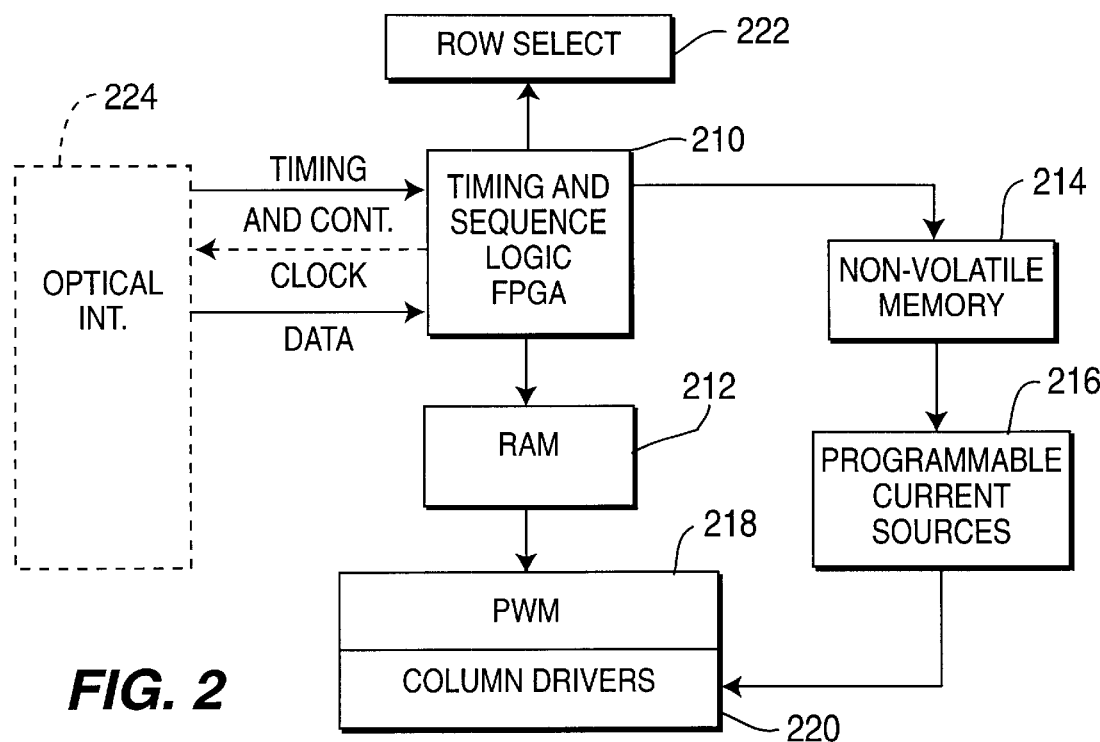
FIG. 2 is a block diagram of image processing and driving circuitry suitable for use in the tile shown in FIGS. 1A and 1B.

FIG. 2 is a block diagram of electronic circuitry which is suitable for use with a display tile according to the present invention. This figure illustrates three major elements of electronics mounted on the circuit board 120 of an exemplary embodiment of the present invention: a memory 212; pixel driving circuitry 214, 216, 218 and 220; and timing circuitry 210. For the sake of clarity, the operational power connections (e.g. power and ground) are not shown in FIG. 2.

As shown in FIG. 2, the exemplary embodiment includes a field programmable gate array (FPGA) 210 which comprises the timing and sequence logic, and receives timing and control signals and an image data signal. As described below, these signals may be provided to the tile by an electrical wiring harness or through an optional optical interface 224 (shown in phantom). The timing and control signal includes a system clock signal, a synchronization signal, and control values which may change the functions performed by the display electronics. When the optical interface 224 is used to receive the data signal and the timing and control signal, the timing and sequence logic circuitry 210 may provide a clock signal, CLOCK, to the optical interface 224.

The circuitry shown in FIG. 2 may be viewed as having four functions: loading and storing compensation data for an individual tile, loading and storing display data for the tile, displaying the stored data, and adjusting to compensate for changes in the brightness performance of individual pixels.

In the exemplary embodiment of the invention, each tile may be separately compensated to ensure that the displayed pixels of all tiles have a uniform brightness with uniform colors. The exemplary method for compensating the tiles is described in terms of an OLED display material. It is contemplated, however, that a similar method may be used with other types of emissive and light modulating display materials.

The level of light emitted by a particular OLED pixel is a function of the level of current provided to that pixel. Thus, the brightness of each pixel in the display is controlled by controlling the magnitude of current that is supplied to that pixel during normal operation. In the exemplary embodiment of the invention, each pixel is either turned on or off. Gray scale is achieved by changing the relative amount of time that each pixel is turned on. The amount of light emitted by a pixel when it is turned on is controlled by controlling the level of current applied to the pixel in the on state. In the exemplary embodiment of the invention, the level of current applied to each pixel may be adjusted to match the amount of light emitted by the pixel to the amounts of light emitted by every other pixel in the display device. The pulse width of the pulse which drives the pixel is changed to modulate the brightness of the pixel when an image is being displayed on the tile.

The exemplary embodiment of the invention employs a passive addressing technique within a block in which only one row of pixels is illuminated at any time. The scanning circuitry steps through each row on the tile and illuminates that row for a predetermined interval. Because each tile is individually scanned, all of the tiles may illuminate a row simultaneously Thus, each time a single tile refreshes its pixels, the entire display device also refreshes its pixels. To minimize display artifacts, it may be desirable to synchronize the scanning signals used by the tiles. For example, it may be desirable to use the same scan timing for all tiles on a row to minimize apparent differences among the tiles on that row. In addition, it may be desirable to synchronize all of the tiles on the display to have the same scan timing. In this instance, immediately after one row of tiles completes its scan, the next row of tiles begins its scan. Thus, the scan line appears to move uniformly down the display device while other scan lines are also moving down the tiled display device. In this configuration, the display device would appear to have a number of scan lines equal to the number of rows of addressing blocks in the device. The row selection circuitry 222 may be, for example, a conventional clocked shift register having a number of stages equal to the number of rows in the addressing block. The shift register clocks a single logic-high value through the rows of the addressing block. As the logic-high value is applied to each row, the pixels in that row are selected.

Referring, again, to FIG. 2, the current applied to a pixel cell on the display device is controlled responsive to a value for the pixel cell that is stored in the non-volatile memory 214. As each line of pixels on the tile is addressed, the addresses of the pixels on the line are applied to the memory 214, which provides a number of compensation values to the programmable current sources 216. The number of values provided equals the number of columns in the display device. Each value is applied to a respectively different programmable current source to provide respective current values to the pixels in the selected row. Thus, as shown in FIG. 2, the programmable current sources are coupled to the column drivers 220. When the column drivers are enabled, they condition the respective pixels in the row to provide a level of current, determined by a respective one of the programmable current sources 216, to the OLED material.

As described above, the display of pixel data is controlled by pulse-width modulating the current signals provided to the selected row of pixels. In the exemplary embodiment of the invention, an optional random access memory 212 stores a number of pixel values which may, for example, correspond to the number of pixels on the tile. When the tile is to display a line of data, the timing and sequence logic 210 selects a row, fetches the line of data corresponding to the selected row and applies the selected data to the pulse width modulator (PWM) 218. The PWM 218 converts the binary values into respective pulse widths and controls the column drivers to apply the current levels provided by the programmable current sources 216 to the column electrodes of the tile. Because only one row is selected, these current values flow through the display materials only on the one row, causing the row to emit light. The memory 212 may hold more or less data than would be required to operate the number of pixels on the tile. If the memory holds less data, then new data may need to be stored into the tile while previously stored data is being displayed. If the memory 212 holds more data, then the circuitry shown in FIG. 2 may display image data for a row of pixels from one image frame while a row of data from the next image frame is being loaded into the memory 212. In general, it is contemplated that the various functions performed by the electronic circuitry shown in FIG. 2, such as loading compensation data, loading pixel data and displaying pixel data, may be performed concurrently.

The timing and sequence logic 210 receives the timing and control signal and decodes the control signal to determine which functions are to be performed. During the manufacturing process, each tile may be calibrated to a nominal brightness value by, for example, mounting the completed tile onto a test fixture which has a photocell corresponding to each pixel position. Each pixel is individually turned on and its brightness is compares to the nominal brightness and a control value for the pixel is applied to the programmable current source 216 for that pixel. When the nominal brightness level is reached, the value applied to the current source 216 is stored into the non-volatile memory 214.

The tile may also include circuitry which automatically adjusts the pixel brightness to compensate for aging of the display material. This circuitry may, for example, allow a viewer to display a predetermined brightness value, select an individual tile and adjust the brightness value up or down to match the brightness of the selected tile to match its neighbors. Alternatively, the tile may include a small light sensor over one or more pixel positions which continually monitors the brightness of that pixel and adjusts the current level applied to that pixel—and the current levels applied to all of the other pixels on the display—to compensate for variations in pixel brightness due to aging of the display. To minimize the visibility of the light sensor, it may be placed away from the active pixel area so that it is responsive to scattered light.

Alternatively, the circuitry 134 may include an all electronic compensation system which continually adjusts the brightness of individual pixels to compensate for aging. The inventor has determined that the decay in the brightness of an OLED pixel that occurs with aging can be predicted by measuring the current and time for a particular pixel, and integrating the product of current and time. This product can be fitted to a characteristic curve and used to adjust the drive current to predict a new drive current which restores the original brightness level of the pixel. As a further improvement, it has been found that the rate of decay for different pixels differs slightly, and the initial decay slope can be measured during burn in and used as a second order correction factor in the algorithm for calculating any change in drive current for that pixel. The exact form of this adjustment depends on the geometry of the pixels and the materials that are used to form the pixels. A suitable adjustment may be readily determined by one skilled in the art of designing OLED displays by monitoring the performance of an exemplary pixel over time.

Another method of compensating for loss in brightness due to aging is to monitor the voltage that is applied to the pixel. For example, at time T0, when the brightness level of the pixels is first adjusted, a current I0 at a voltage V0 produces brightness B0. At some later time T2, two changes occur; it now takes voltage V2 to produce the same constant current I0, and the brightness at this I0 is now B2 (B2<B0). The inventors have determined that the change in voltage dV=(V2−V0) is proportional to the change in brightness dB=(B2−B0). Knowing this proportionality constant allows for electronically calculating a new current I2 that will produce the original B0. This algorithm can be incorporated in the electronics on the electronic drive block, and the result is that the brightness can be maintained at constant brightness automatically without manual adjustments. This proportionality constant varies for different pixel geometries and different OLED materials. It can be easily determined by one skilled in the art of designing OLED displays by monitoring the performance of an exemplary pixel over time.

Alternatively, an external system of reestablishing the brightness uniformity may be employed. Such a system may, for example, incorporate a sensor that detects and measures individual pixel brightness and some means to communicate with the display electronics so that the correct drive voltage needed to establish the desired brightness can be stored in the display tile memory.

While specific examples have been given, it is contemplated that any of these methods for adjusting the current applied to a pixel in order to maintain a predetermined brightness level may be combined with any other method either as a check or to augment the performance of the other method.

The exemplary display device calibrates the brightness of the pixels using a method (i.e. current control) which is orthogonal to the method (i.e. pulse-width modulation) which is used to control the pixels to achieve gray scale. This is advantageous as it allows the individual pixels to be calibrated to display brightness levels which are consistent across the entire dynamic range of the display.

Figure 3:
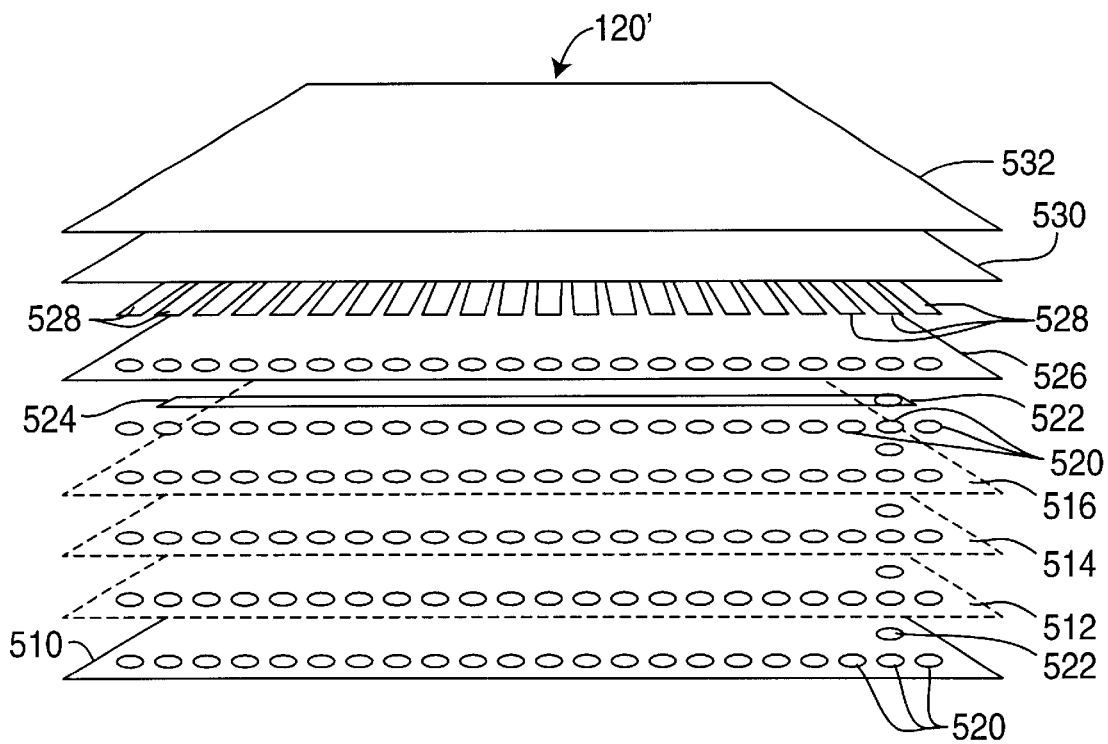
FIG. 3 is an exploded perspective drawing which illustrates an alternative structure that may be used to implement the tile shown in FIGS. 1A and 1B.

FIG. 3 is an exploded perspective drawing which illustrates an exemplary structure of a tile 120. The exemplary tile shown in FIG. 3 may be formed as a separate electronics section and display section or it may be formed as a single structure. In addition, the connections to the row and column electrodes of the tile are made along two edges of the tile.

The circuit board for the tile shown in FIG. 3 is the bottom layer 510. This circuit board may include, for example, an electronics module such as the circuit 134 shown in FIG. 1A and layers of interconnects to connect the components of the electronics module. The electronics module is coupled to the row and column electrodes of the display device through column vias 520 and row vias 522. Only one row via 522 is shown in FIG. 3. In the exemplary tile shown in FIG. 3, the circuit board is level 510 and optional levels 512, 514 and 516, shown in phantom, are interconnecting layers. These may be ceramic layers having vias to connect to higher layers and conductive traces painted or printed on one surface of the layer. If the tile structure is formed from an LTCCM material, one of the layers 512 or 514 may be a metal layer or an insulating structural substrate. Layer 516 is a ceramic layer having column vias 520 and row vias 522. The row vias formed on the ceramic layer 516 connect to the row electrodes 524 of the exemplary display tile.

If the tile shown in FIG. 3 is formed from separate electronics and display sections, then the electronics section includes only the layer 510 and the optional layers 512, 514 and 516. If the tile is formed as a single piece then the display material 526 is deposited on top of the row electrodes 524. In the drawing FIG. 3, the display material 526 is illustrated as a solid sheet. This material, however, may be distinct electron injecting layers and distinct OLED cells deposited on the row electrodes. Using distinct cells of display material, physically and electrically separate from neighboring cells, as illustrated in FIGS. 4A, 5, 6A, 6B, and 12, increases display contrast by greatly reducing both electrical and optical crosstalk between pixels, and sub-pixels. The row electrodes may be formed from a metal; such as aluminum, titanium, tungsten, gold, or copper; from polysilicon; or from a multilayer structure including such conductors.

The column electrodes 528 are formed on top of the display material 526. The column electrodes are connected to the circuit board through the vias 520 which extend through each level of the display tile from level 510 through level 526. Each column electrode is coupled to a respectively different via 520. The column electrodes 528 are typically formed from a transparent conductive material such as indium-tin oxide (ITO) or polyaniline. In the exemplary embodiment of the invention, level 530, formed above the column electrodes 528 may be an optical filter or it may be a patterned black matrix which covers the inactive areas of the display layer 526 with black lines while providing openings for the active elements of the display material. The final layer of the display tile shown in FIG. 3, is a float glass front cover 532.

If the tile shown in FIG. 3 is formed as separate electronics and display sections, then the display section may be formed in the following manner. First, the filter or black matrix layer 530 is deposited on the float glass cover 532. Next, the transparent column electrodes 528 are deposited, then the OLED materials are formed on the column electrodes and the row electrodes 522 are formed to cover the OLED materials. The exemplary separate electronics and display sections shown in FIG. 3 may be joined by bump-bonding the row and column vias along their edges or by inserting conductive elements, for example wires, into the row and column vias on one of the sections such that the conductive elements protrude from the vias. The conductive elements would then mate with the corresponding vias on the other section when the sections are joined.

The tile structure shown in FIG. 3 may be formed by first preparing green tape blanks for the layers 510, 512, 514 and 516. Next, the blanks are punched with holes through which the vias 520 and 522 will be formed. After the blanks are punched, they may be painted or printed with suitable conductive material to fill in the vias and to provide any conductive traces which may be needed to interconnect other circuitry in the display tile. The traces printed on the green tape sheet 516 may include the row electrodes 524. This structure including layers 510, 512, 514 and 516 as well as the vias 520 and 522 and the row electrodes 524 is then laminated and fired to form a ceramic substrate for the circuit component of the display device. At this point, a planarization layer may be added to the ceramic substrate to improve surface smoothness and thereby assist in fabication of the pixel structures. The planarization layer may be formed of a number of materials that form a highly smooth surface, such as spin-on-glass. Next, the display materials 526 are deposited on the row electrodes 524. After depositing the display material 526, the column electrodes are formed on the tile using conventional processes for depositing ITO.

As an alternative to forming a laminate green tape structure, which is fired to form a ceramic structure, the circuit board 510, may be planar ceramic material, such as alumina. OLED display layers are sensitive to water vapor and oxygen. These agents must be blocked from passing through the base substrate. An advantage of alumina is that it forms a satisfactory blocking layer. Vias may be fabricated in so that they also block water vapor and oxygen. In this instance, the layers 512, 514, and 516 shown in FIG. 3 may not exist. Alternatively, layer 512 may be spin-on-glass. The spin-on-glass layer may be desirable as a planarization layer to improve surface smoothness and thereby assist in fabication of the pixel structures. Additionally, for ceramic materials that do not form a satisfactory blocking layer, the spin-on-glass layer may provide the additional advantage of being a blocking layer.

The alumina circuit board may be machined, or otherwise worked by processes such as etching, to provide the necessary vias and the worked circuit board may then be processed in the same way as the fired ceramic circuit board described above.

In a separate step, the black matrix or filter 530 may be formed on the float glass cover 532. The combined mask and cover is then aligned with the display device such that the openings in the mask correspond to the active pixel regions of the display material. The glass cover 532 is then sealed to the alumina circuit board or composite fired ceramic structure using, for example, a frit glass. Alternatively, the pixel structures may be formed on the glass cover, as in the two section construction described above, and then aligned to the alumina circuit board or composite fired ceramic structure and sealed.

FIGS. 17A–F are top view drawings showing an exemplary display tile of the present invention. Each successive figure shows an additional layer which has been added to the glass substrate. In this embodiment both the display section and the electronics section are formed on the same side of a single glass substrate without a separate circuit board for, the electronics section. The exemplary embodiment depicted in FIGS. 17A–F has only four pixels. The number of pixels shown has been selected for clarity in the drawings and is not meant to illustrate a constraint on the number of pixels that may be employed in a display tile constructed according to this embodiment of the present invention.

Figure 17:
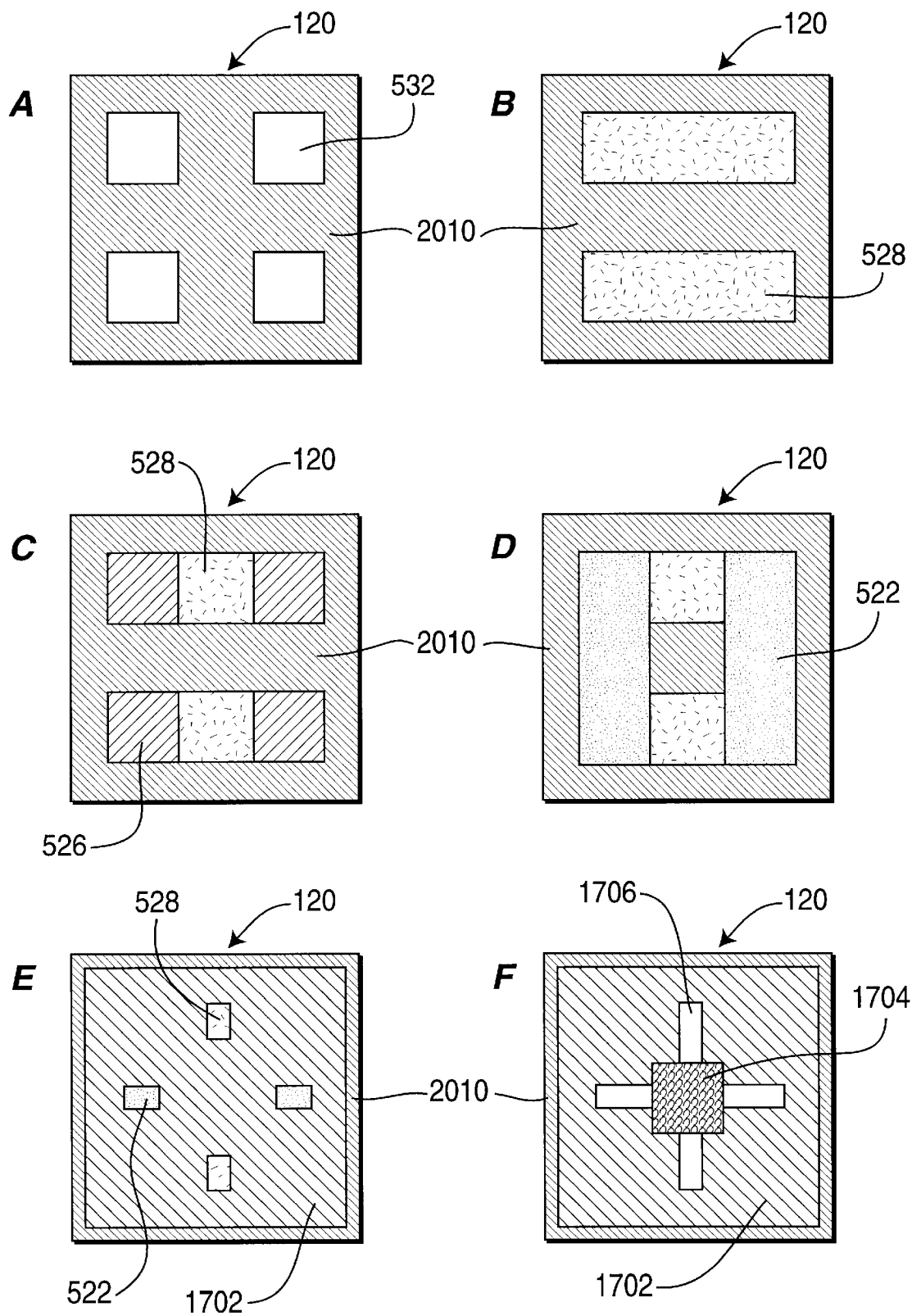
FIG. 17A is a top view of the first layer an exemplary video tile with the display section and electronic section coupled to the same side of a glass substrate.
FIG. 17B is a top view of two layers the exemplary video tile of FIG. 17A.
FIG. 17C is a top view of three layers the exemplary video tile of FIG. 17A.
FIG. 17D is a top view of four layers the exemplary video tile of FIG. 17A.
FIG. 17E is a top view of five layers the exemplary video tile of FIG. 17A.
FIG. 17F is a top view of the complete exemplary video tile of FIG. 17A.

FIG. 17A illustrates a black matrix mask 2010 that has been deposited on the inner surface of the glass substrate 532. The black matrix mask is patterned to cover the entire inner surface of the glass substrate except for windows corresponding to the active pixel areas. Alternatively, the black matrix mask may be deposited on the outer surface of the glass substrate. In this case the black matrix mask may conform to the dimensions previously described with regard to FIGS. 10 and 11.

The next figure, FIG. 17B, illustrates transparent column electrodes 528 which have been deposited on top of the black matrix mask 2010. These electrodes may be composed of multiple layers. The electrodes are shown substantially matching the height of the windows in the black matrix mask. It is contemplated that the transparent column electrodes may be either smaller or larger than these windows. Portions of the electrodes that extend outside of windows may be opaque.

FIG. 17C shows display material 526 which has been formed in patterned portions on top of the transparent column electrodes. Additionally a passivation layer, not shown, may be added to cover areas of the transparent electrodes 528 that are not covered by the display material to prevent contact between the row electrodes and the column electrodes.

FIG. 17D shows row electrodes 522 which have been formed covering the display material 526. The row electrodes, similarly to the transparent column electrodes, may be formed by a multi-layer process or in a single layer of conductive material. FIG. 17E shows a passivation layer 1702. This passivation layer is used to both electrically isolate and seal the layers of the display section, particularly the display material 526. The passivation layer may be composed of either a transparent or opaque material and may cover the entire back surface of display tile 120, although here it is illustrated as leaving a small gap along the edges uncovered. The passivation layer is patterned to contain vias through which connections may be made to both the transparent row electrodes 528 and the column electrodes 522.

FIG. 17F shows an electronics module 1704 mounted in section of display tile 120 directly over a portion of the glass substrate 532 which has been covered by the black matrix mask 2010. This orientation of the electronics module insures that the electronics module is not visible to a viewer viewing the display. Also by placing the electronics module only in sections covered by the black matrix mask it may be possible to reduce the effect of possible hot spots caused by the electronics modules. Also shown in FIG. 17F are contacts 1706 which extend from the electronics module to the gaps in the passivation layer 1702 and electrically couple the electronics modules to the row and column electrodes below.

Although the electronics modules in FIG. 17F are shown disposed upon the passivation layer 1702 it is contemplated that the electronics modules may be coupled to the back side of the display tile in this embodiment by a method whereby the electronics modules are not in direct contact with the passivation layer such as by solder bumps or flip chip technology. In these cases the method of using long leads to assist with thermal management of the display tile may be employed in this embodiment. Further if the passivation layer 1702 is composed of an opaque material then the electronics modules may be arranged in areas which are not covered by the black matrix mask without becoming visible to viewers of the tiled display system.

It is also contemplated that a protective layer may be deposited over the electronics section of the tile to seal the tile and protect the display materials from water vapor and oxygen.

Figure 4:
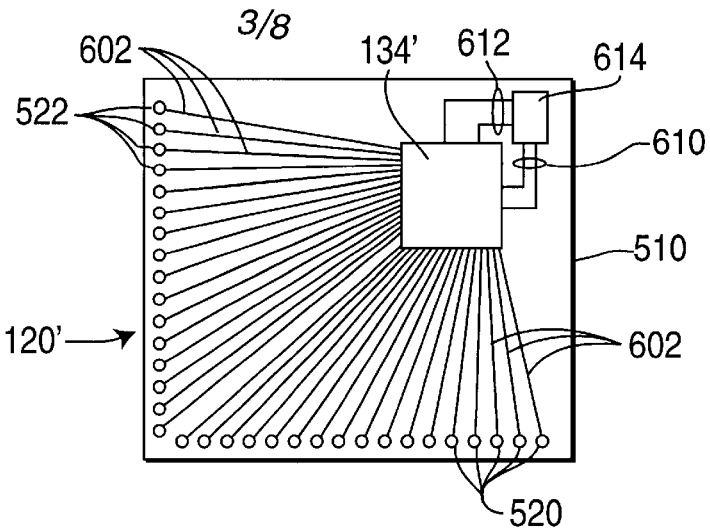
FIG. 4 is a back plan view of a tile having the structure shown in FIG. 3.

FIG. 4 is a bottom plan view of the display tile shown in FIG. 3. As shown in FIG. 4, the circuit board 510 includes electronic circuitry 134' which is connected to the rows and columns of the display through the vias 520 and 522 respectively. In the exemplary embodiment of the invention, the conductors 602 which connect the circuitry 134' to the vias 520 and 522 may be printed or painted onto the green tape prior to firing, as described above. Alternatively, these vias may be painted or printed onto the worked alumina circuit board. The connectors 602 are coupled to the vias 520 and 522 along the edge of the circuitry 134'. The circuitry 134' is coupled to receive operational power via conductors 610 and to receive the data signal and timing information via conductors 612 and a connector 614. The connector 614 may be coupled to a cable harness when the tile 120' is assembled into a tiled display device such as the device 100 shown in FIG. 1.

Figure 4A:
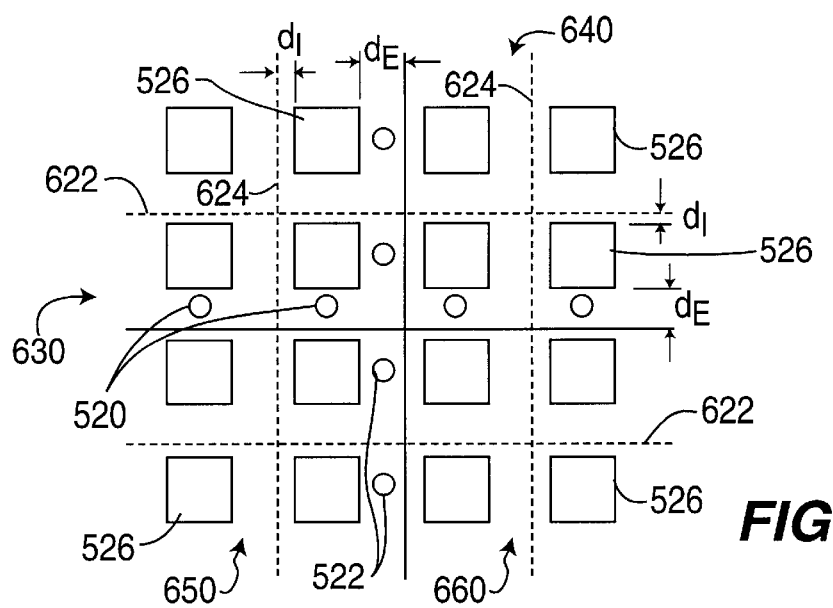
FIG. 4A is a pixel diagram which shows an exemplary pixel layout for portions of four tiles having the structure shown in FIG. 3.

FIG. 4A is a pixel diagram which illustrates an exemplary pixel spacing that may be used in the tile shown in FIG. 3. This pixel spacing allows the conductive vias to be arranged along the edge of the tile, without locally distorting the inter-pixel distance in the assembled tiled display. FIG. 4A illustrates portions of 4 tiles, 630, 640, 650, and 660. The dashed lines 624 and 622 illustrate tile boundaries. These lines are provided only as a guide in understanding the pixel layout. The active portion 526 of the pixels occupies only about ¼ of the total pixel area. This defines a pixel aperture of approximately 25%. In this exemplary embodiment of the invention, the active region is not centered in the pixel area but is offset to the left and top as shown in FIG. 4A.

As shown in FIG. 4A, this spacing of the pixels leaves room along the edges of the display for the vias 520 and 522 to connect electronic driving circuits to the row and column electrodes of the pixel without interfering with the regular spacing of the pixels across tile boundaries. The vias may be placed such that they are not directly in contact with the row and column electrodes, but are otherwise electrically coupled to the electrodes. This electrical coupling may be accomplished by small tabs of metal or other electrode material extending from the electrodes, or by gold bonding, or other standard electronics practice. In the exemplary embodiment shown in FIG. 4A, the distance $d_e$, which is the distance from the active region 526 to the edge of the tile, is approximately twice the distance $d_I$ which is the internal distance from the edge of the active area of the pixel 526 to the pixel boundary 522 or 524.

Although the pixel diagram shown in FIG. 4A has the active region of the pixel offset both horizontally and vertically, it is contemplated that the active area may be offset only vertically. In this configuration, the contacts to the row electrodes are beneath the active pixel material and, thus, do not need to offset the active region of the pixel. It is also possible to stagger the vias and contacts to spatially separate the vias.

Figure 5:
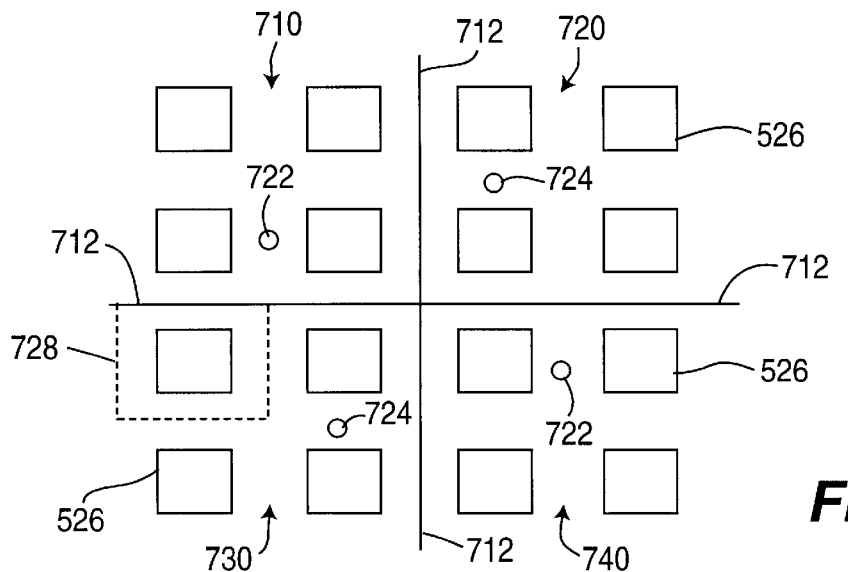
FIG. 5 is a pixel diagram which shows an alternate exemplary pixel layout for portions of four tiles having the structure.

FIG. 5 is an alternative pixel layout. In the layout shown in FIG. 5, the active portions 526 of the pixels are centered in their respective pixel regions and the vias which connect the row and column electrodes of the display to the electronics are formed between respective pixel elements. The distance between the edge of an active region 526 and the edge 712 of the display is equal on all sides of the tile and the distance from the center of the active pixel region to the edge is ½ of the pixel pitch. As described below with reference to FIG. 13 and 13A, however, the distance between the center of an edge pixel and the edge of the tile may be slightly less than ½ of the pixel pitch in order to allow a mullion to be inserted between adjacent tiles. As described below, mullions are typically used both to join tiles on the display device and to hide the edges where the tiles meet.

Figure 6A:
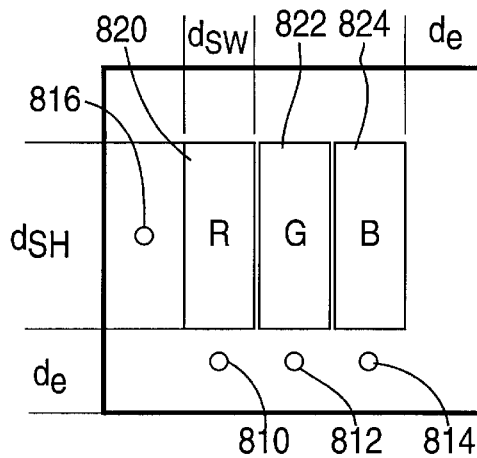
FIG. 6A is a front plan view of a single color pixel structure which includes separate sub-pixels.
Figure 6B:
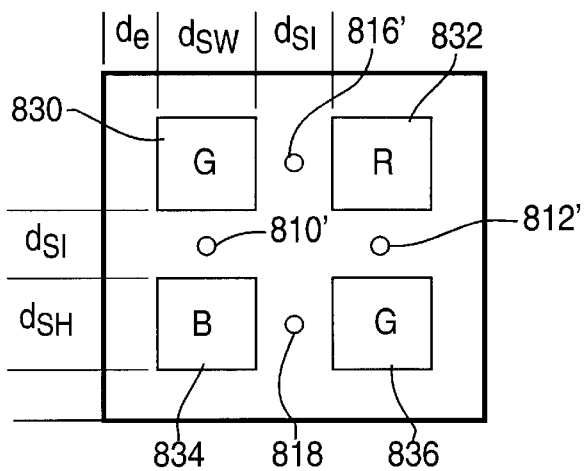
FIG. 6B is a front-plan view of an alternative single color pixel structure which includes separate sub-pixels.

The displays described above have been, in general, monochrome displays. The pixels have a single emissive area which is controlled by a single row and column electrode pair. Color pixels may be implemented as shown in FIGS. 6A and 6B. FIG. 6A shows a single pixel having separate red (R) 820, green (G) 822 and blue (B) 824 sub-pixels. The three sub-pixels 820, 822 and 824 each has a respective column electrode (not shown) which may be connected to the electronics section by the vias 810, 812 and 814, respectively. In an exemplary embodiment of the present invention, only one of vias 810, 812, and 814, is formed within a given pixel. As long as at least one via exists for each column electrode proper connectivity may be achieved. A single row electrode (not shown) is used by all three of the sub pixels. This row electrode is coupled to the electronics section by the via 816, shown in phantom. The geometry of the triple sub-pixel structure is defined by $d_{SH}$, the height of the sub-pixel, $d_{SW}$, the width of the sub-pixel, and $d_e$, the distance from the active sub-pixel areas to the edge of the pixel area. For one exemplary embodiment of the invention, these dimensions are given in Table 1 in terms of the pixel pitch, P.

TABLE 1

| | |
|---|---|
| $d_{SH}$ | .5 P |
| $d_{SW}$ | .16 P |
| $d_e$ | .25 P |

It should be noted that the number contact points layers for an electrode within the circuit board layers is not constrained by the number of vias. Multiple contact points may branch out from a single via.

FIG. 6B illustrates an alternative color pixel structure. This structure includes four sub-pixel elements, 830, 832, 834 and 836. In one exemplary embodiment, two of these sub-pixel elements, 830 and 836 emit green light when stimulated while the other two pixel elements, 832 and 834 emit red and blue light, respectively. This structure is known as a quad sub-pixel structure. The structure uses two green sub-pixels because more of the luminance information in a color display is in the green pixels than is in either of the red or blue pixels. Thus, the use of two green sub-pixels allows for a brighter display. Alternatively, the pixels 830 and 836 may both be red or blue pixels. In some display technologies, the amount of light emitted by the red or blue pixel material may be less than the amount of light emitted by the green pixels. In this instance, making the pixels 830 and 836 both red or blue pixels, respectively, would improve the overall brightness of the display. It is also contemplated that it may be desirable to use colors other than, or in addition to, red, blue, and green in some display technologies. The pixel structure shown in FIG. 6B employs two row electrodes (not shown) and two column electrodes (not shown). The row electrodes are coupled to the electronics section by the vias 816' and 818 (shown in phantom) while the column electrodes are coupled to the electronics section by the vias 810' and 812'. The geometry of the quad sub-pixel structure is defined by the dimensions $d_{SH}$, the height of the sub-pixel, $d_{SW}$, the width of the sub-pixel, $d_e$, the distance from the active sub-pixel areas to the edge of the pixel area, and $d_{SI}$ the distance between adjacent sub-pixels. These values are defined in Table 2 for the exemplary embodiment of the invention.

TABLE 2

| | |
|---|---|
| $d_{SH}$ | .25 P |
| $d_{SW}$ | .25 P |
| $d_e$ | .125 P |
| $d_{SI}$ | .25 P |

While FIGS. 6A and 6B show the distances $d_e$ and $d_{SI}$ as being equal in the horizontal and vertical directions, it is contemplated that these values may be different. The exemplary pixel structures shown in FIGS. 6A and 6B both have active pixel portions covering approximately 25 percent of the pixel area to produce a pixel aperture of approximately 25 percent. This value is exemplary only. The invention contemplates both larger and smaller pixel apertures.

Figure 7:
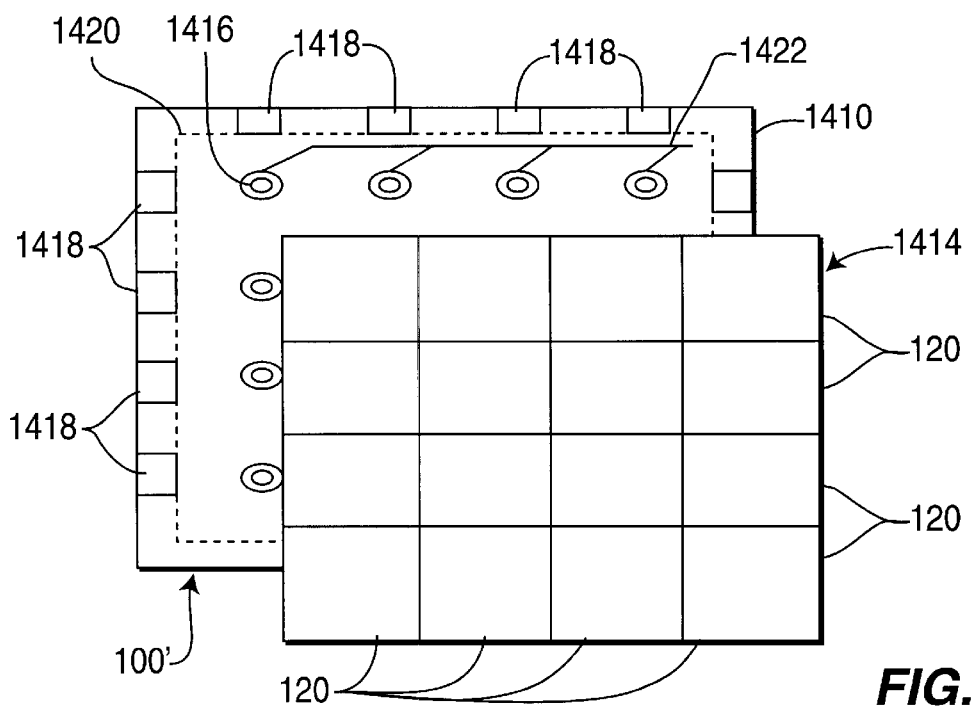
FIG. 7 is an exploded isometric drawing which illustrates an exemplary mounting method suitable for use with the tiled display shown in FIG. 1.

FIG. 7 is an exploded front plan view of an exemplary self aligning tile assembly structure according to the present invention. In FIG. 7, the frame 1410 includes a plurality of spring elements 1418. In addition, the power, timing, and data signals are brought to the individual tiles by respective flexible connectors 1416. The connectors 1416 may also act to push the tile forward to make contact with a float-glass front plate (not shown). The connectors 1416 are coupled to receive the power, data and timing signals via a wiring harness 1422. In the exemplary embodiment of the invention shown in FIG. 7, each of the tiles is mounted, within the frame 1410, on its respective flexible connector 1416. When a row or column of the tiles is fully assembled, the springs 1418 of the frame 1410 tend to confine the tiles to an area indicated by the dashed line box 1420. When all of the tiles are assembled into the frame 1410, the springs 1418 act to hold the tiles in alignment. To augment the self-aligning structure, the edges of each tile may be formed in complementary patterns (not shown) such that the patterns of adjacent tiles mate, holding the tiles in alignment. For example, opposite edges of a tile may be patterned with complementary serrated edges which allow each tile to mate with an adjacent tile in only one position. If the tiles are formed in two parts, it is contemplated that these edge patterns may be made on the display section or on the electronics section. Making the edge patterns only on the electronics section is desirable as it simplifies the edge fabrication for the display sections. If the tiles are formed on single substrates, the substrates may be formed with complementary edge patterns.

FIGS. 8 through 13 illustrate another exemplary method by which tiles 120 may be joined to form a composite tiled display 100. By definition, there is a physical gap between the tiles in a tiled display. It is desirable to make this physical gap invisible to the viewer. Invisible in this context means that light emitted by the pixels that may be scattered or refracted at the gap should not be seen by a viewer, and that no external line-of-sight exists which would enable a viewer to detect the physical gap.

State-of-the-art tiled displays using CRTs or projection displays use a mullion between the individual displays to hide the physical gap, however, these mullions are visible to the observer and are also objectionable to the viewer because they break the continuity of the image. It is, therefore, desirable that any structure used to make the gap invisible does not break the continuity of the larger image.

Another structure commonly found in both tiled and non-tiled displays is a black matrix. A black matrix may be fabricated from black lines, placed between the active portions of the pixels to absorb ambient light in these areas in order to increase the display contrast. Black matrix lines may be found, for example between the phosphors on the front screen of a CRT or between the pixel positions defined for a liquid crystal display. In tiled displays, black matrix lines are typically smaller than mullions and are typically placed in the plane of the pixels. Because the black matrix lines are periodic and placed between the pixels, they do not tend to break the continuity of the image.

Figure 13A:
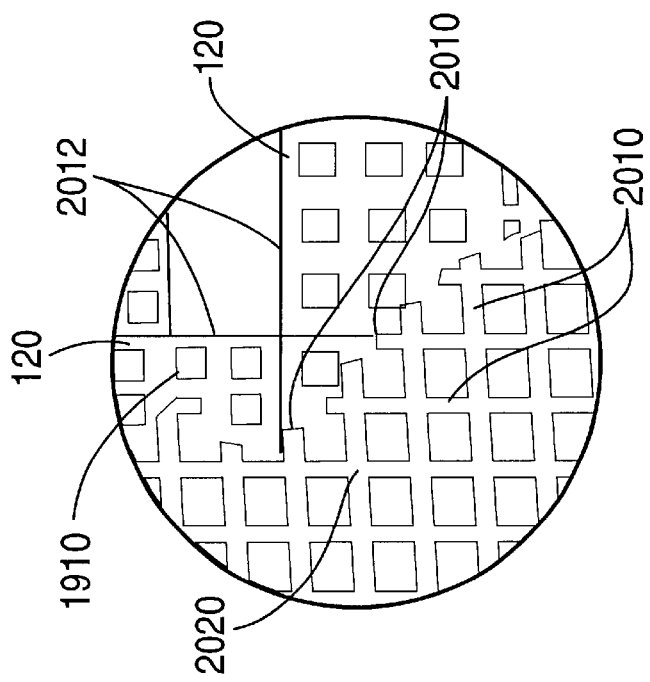
FIG. 13A is a detailed view of a portion of the partially exploded perspective view shown in FIG. 13.
Figure 13:
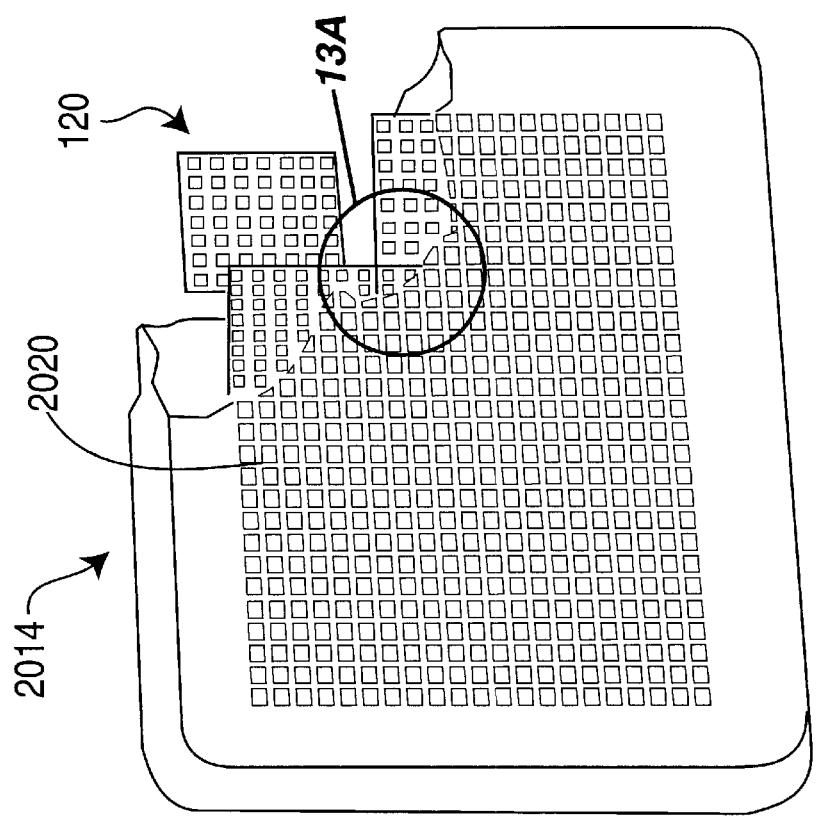
FIG. 13 is a partially exploded perspective view of the tiled display shown in FIG. 1 which is useful for describing an exemplary mounting method and an exemplary implementation of a black matrix for the tiled display.

The present invention employs an optical structure that may be incorporated in a tiled display to make the physical gaps between the tiles indistinguishable from the black matrix and, thus, invisible to the viewer. An illustration of this structure is shown in FIGS. 13 and 13A. FIG. 13 is a cut-away perspective drawing of a partially assembled display device. FIG. 13A shows details of a portion of the display device shown in FIG. 13. The main components of the structure shown in FIG. 13 are a frame 2014, a transparent sheet 2020 of, for example, glass or plastic, a plurality of black lines 2010 that form a black matrix and the tiles 120 which form the display. The key feature of the optical integrator structure is a pattern of black lines 2010 which are similar to black matrix lines in that they have equal widths and a spacing equal to the pixel pitch. These black lines 2010 may be aligned to lie between all pixels in the display, including those pixels on either side of the gaps 2012 between the tiles 120. The optical integrator pattern of black lines are also similar to mullions in that some of the black lines in the optical integrator structure lie on top of the gaps between the display tiles and block their visibility. As assembled, the glass substrates 532 of the tiles 120 are positioned adjacent to the black lines 2010 on the back surface of the transparent sheet 2020, which forms the integrating structure.

Unlike a conventional black matrix, the disclosed optical structure for integrating display tiles is placed above the plane containing the pixels (like mullion structures), on the viewer-side of the tiles 120, with the black line pattern being in contact with the display tiles. Unlike mullions, the black lines on the optical integrator structure 2020 are relatively narrow, so that the black lines which cover the mullions are essentially the same width as the black lines which form the black matrix. Thus the disclosed structure simultaneously provides the functions of the black matrix and the mullions, but the mullion lines are not visible, as such, to the viewer because all lines in the pattern on the optical integrator structure 2020 are essentially the same and are virtually indistinguishable. Accordingly, the viewer simply sees a uniform pattern of black lines.

Figure 8:
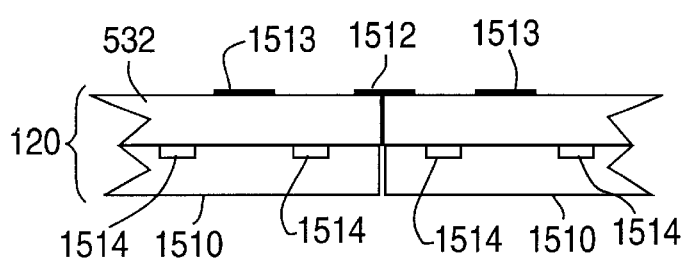
FIG. 8 is a cut-away side plan view of a portion of the tiled display shown in FIG. 1 which illustrates an exemplary method for joining adjacent tiles.

To more easily explain the optical integrator structure shown in FIG. 13, a method of joining tiles using discrete mullions is first described. FIG. 8 is a cross section of portions of two tiles 120, according to the present invention, which are joined by a mullion. Each of the tiles includes a glass substrate 532 and the remainder of the tile structure 1510. The exemplary tiles include active display material 1514 located proximate to the bottom surface of the glass substrate 532. The exemplary tiles also include a mullion 1512 and black lines 1513 which form a portion of the black matrix.

Figure 9:
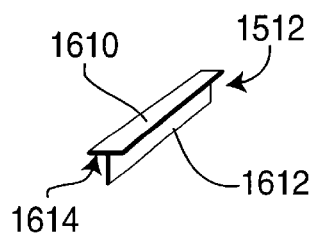
FIG. 9 is a perspective view of a mullion suitable for use with the joining method shown in FIG. 8.

FIG. 9 is a perspective drawing of an exemplary mullion 1512 suitable for use with a display device according to the subject invention. The mullion 1512 includes a top surface 1610 which may be formed from a black material or may be printed or painted black. To ensure that the mullion does not create artifacts on the display device, it is desirable for the top surface of the mullion to closely match the black stripes in size, color and gloss. The mullion 1512 also includes a bottom stem having side surfaces 1612 which are desirably formed from a light-colored material (e.g. white). Alternatively, the bottom stem of the mullion may be transparent and have an index of refraction close to that of the float glass substrate 532. It is desirable for the bottom stem of the mullion to be light-colored or transparent so that any light scattered in the vicinity of the mullion has the same properties as light that is scattered among pixels at the interior of a tile. If light scatters differently at the edge of a tile than near the center then the edge may be visible, for example, as a band of reduced brightness in the displayed image. One or more of the side surfaces 1612 and the underside 1614 of the top bar of the mullion may be coated with adhesive to attach the mullion 1512 to the two tiles which it joins. If all of these surfaces are coated with adhesive, the mullions may be used to join the tiles into a display device.

Figure 10:
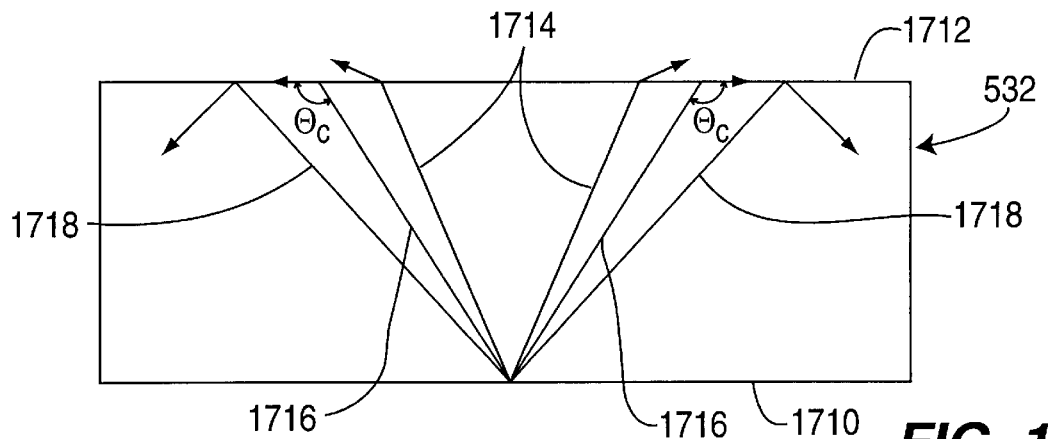
FIG. 10 is a cut-away side plan view of the glass plate of a pixel of a tile having the structure which is useful for describing a method for forming a black matrix for the tile.

To determine the optimum placement for a black stripe or a mullion on the front surface of the glass substrate of an emissive display, it is helpful to understand the properties of light emitted by the display. FIG. 10 shows a cross section of an exemplary glass substrate 532 which includes a bottom surface 1710 and a top surface 1712. A number of representative optical rays, 1714, 1716 and 1718 are shown emanating from a point on the bottom surface 1710. Some rays 1714 exit the glass and some rays 1718 are totally internally reflected from the top surface and are trapped in the sheet of glass. At the transition between these two types of rays are rays 1716 which are refracted to an angle parallel to the top surface 1712 of the substrate 532.

The angle of incidence of the rays 1716 which are at the transition is called the critical angle ($\theta_c$). Light reaching the surface 1712 with angles less than the critical angle exits the glass, and light reaching the surface 1712 with angles larger that the critical angle are totally internally reflected. The critical angle is dependent on the index of refraction, $n_{glass}$, of the glass substrate 532 as shown in equation (1):

$$\theta_c = \text{Sin}^{-1}(1/n_{glass}) \quad (1)$$

In the exemplary embodiment of the invention, $n_{glass} = 1.55$ and $\theta_c \cong 40°$.

Figure 11:
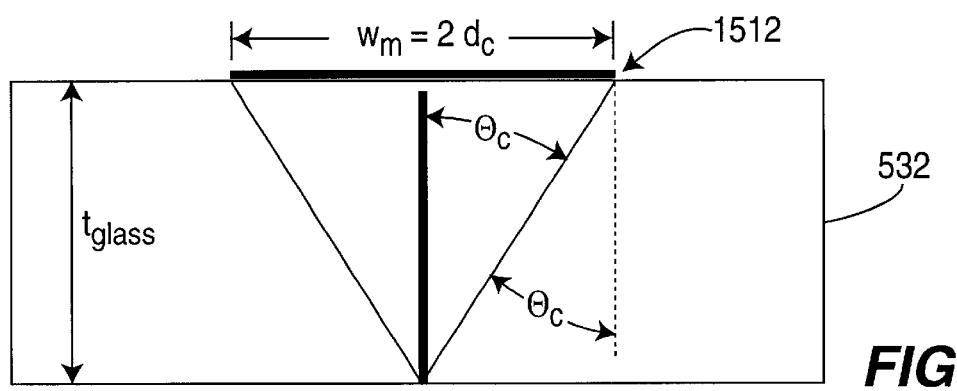
FIG. 11 is a cut-away side plan view of a portion of the glass plates of two adjacent tiles which shows how the tiles may be joined by a mullion such as that shown in FIG. 9.

A tiled display is made of tiles that are placed in an array so that the spacing between pixels across the gap between tiles is substantially the same as the pitch between pixels within the display tires. Thus, the display tile edge is one half pitch distance (or slightly less) from the center of the last pixel. Because of the critical angle, light emitted from a point within a sheet of glass can travel at most a lateral distance of $d_c = t_{glass} \text{Tan}(\theta_c)$, where $t_{glass}$ is the thickness of glass. Therefore, light from any part of a gap region may be blocked by putting a black stripe of width $W_m > 2d_c$ over the gap region. Such a black stripe is shown in FIG. 11 as the top of the mullion 1512. Because of the symmetry of optics, the same black stripe blocks any external rays from making the gap region visible. Thus this black stripe makes the gap region invisible to an observer. In practice, the black stripe may need to be slightly wider than $2d_c$ to account for any finite width of the gap.

Referring, again, to the structure shown in FIGS. 13 and 13A, the individual tiles do not need to be joined by discrete mullions. Instead, the tiles may be assembled directly on the back surface of the optical integrating structure 2020 such that the gaps are positioned directly over black stripes having a width $W_m$. As shown in FIGS. 13 and 13A, the exemplary optical integrating structure 2020 is positioned on top of the array of tiles, with the black lines on the surface of the structure in contact with the glass substrates 532 of tiles. The centers of the black lines are aligned with the gaps between the tiles so that the gap regions can not be seen by an observer. Although this embodiment of the invention does not need discrete mullions, if the tiles are connected by mullions 1512, the integrating structure 2020 may include black lines that cover the top surfaces 1610 of the mullions. In this instance it would be desirable for the top bar of the mullion to be as narrow as possible to minimize any gap between the top surface of the tile 120 and the back surface of the integrating structure 2020. Alternatively, the mullions 1512 may be assembled onto the integrating structure 2020 with the black matrix lines. In this configuration, the mullions form pockets into which tiles 120 are inserted to form the composite display. This structure may be formed by attaching the mullions directly to the integrating structure 2020 using an adhesive and then applying an adhesive to the undersides of the crossbars 1610 and to the sides of the stems before inserting a tile into the display.

The black lines on the optical integrating structure 2020 that form the mullions which are used to cover the inter-tile gap tend to be wider than the typical black matrix line and may block some or all of the light emitted from the pixels near the edge of the tile. To allow the maximum amount of light to pass and yet avoid any artifact distortion in the assembled display device, the display tiles and the black stripes on the integrating structure 2020 are desirably specifically designed to have particular relationships.

Figure 12:
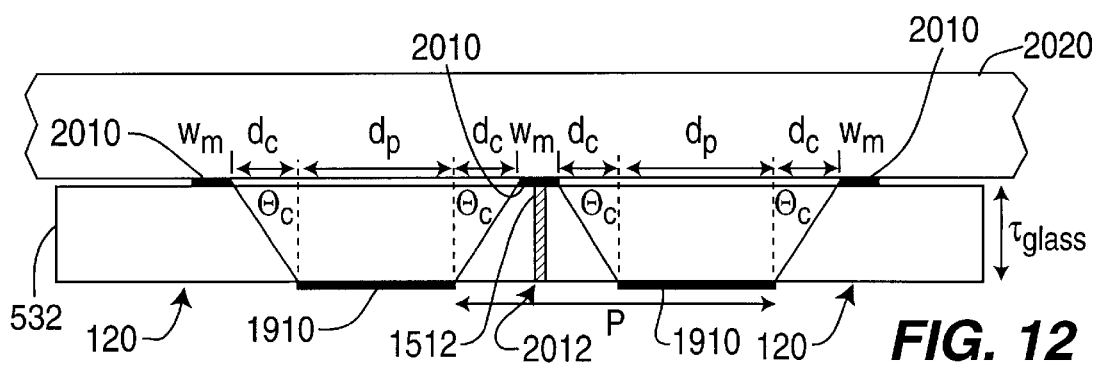
FIG. 12 is a cut-away side plan view of the glass plate of two adjacent pixels of two adjacent tiles which is useful for describing a method for forming a black matrix for the display.

FIG. 12 shows a cross section of a pixel which includes two pixel regions. The emissive regions 1910 at the bottom of the glass substrate 532 have a width $d_p$. The light rays that can exit the glass section and are useful for viewing, exit the top of the glass 532 in an area having a width $w = 2d_c + d_p$. A display tile has an array of pixels equally spaced a distance known as P, the pixel pitch. Therefore, to not block any viewable light, it is desirable for the black matrix to have a width, $W_m < P - d_p - 2d_c$. The dimensions illustrated in FIG. 12 depict the case where the black matrix stripe completely hides the gap and yet, blocks no emitted light.

There are two width criteria to be met by the black stripes that form the black matrix, and the top bar of the mullions: $W_m > 2d_c$ (to hide the gap), and $W_m < P - d_p - 2d_c$ (to avoid blocking light from the pixels). The most desirable solution is the design point with the largest glass thickness, where both criteria are met. That design point is met when the thickness of the glass is 0.15 times P, the pixel pitch, and the width of the black stripe is 0.25 times the pixel pitch. Designing the display tile and black matrix stripes to meet that condition results in making a large area display by integrating individual tiles behind the optical integrating structure has the result that the individual tiles having inter-tile gaps that cannot be detected.

When the thickness of the glass substrate 532 and the width of the black stripe satisfy the criteria described above, no light that is directed toward a viewer directly in front of the display (e. g. viewing from a normal angle) is blocked, and no light from greater viewing angles is blocked. When the thickness of the glass substrate 532 and/or the width of the black stripe are greater than the criteria described above, no light that is directed toward a viewer directly in front of the display (e. g. viewing from a normal angle) is blocked, but some light from greater viewing angles may be blocked.

As described above, in the exemplary embodiment of the invention, the pixels on the tiles have an aperture of approximately 25% in order to allow room within the pixel for a via to make electrical contact with a column electrode. Thus, in the exemplary embodiment of the invention, $d_p$ is approximately P/2. This relatively small aperture also has advantages by making it easier to hide the inter-tile gap and allowing a relatively large-stripe black matrix to improve the contrast of the display.

It is contemplated that the contrast may be further improved by coating the viewer-side of the integrating structure 2020 with an antireflection coating and/or by adding an ambient light absorber or color filter on that surface or in the bulk of the material (e.g. glass or plastic) from which the optical integrating structure 2020 is constructed.

It is also contemplated that the integrating structure 2020 may include a diffuser coating on the viewer-side surface. This diffuser enlarges the apparent size of the pixels reducing the visibility of the individual pixels and black matrix structure. Thus, a diffuser may act to reduce the graininess of the displayed image. This may be significant, especially for display devices having relatively large pixels or which have smaller pixels but are designed to be viewed at close proximity to the display device. Another method by which the visibility of the pixel structure may be reduced is to use a quad pixel structure, such as that shown in FIG. 6B, in which spaced single-color sub-pixels form a single color pixel.

The integrating structure 2020 also provides a simple way to align and mount the display tiles. In particular the patterns on the integrating structure 2020 may be accurately aligned with the pixels using, for example moiré patterns, to position a tile and then the tile may be mounted onto the structure 2020 with an optically clear adhesive.

Figure 14:
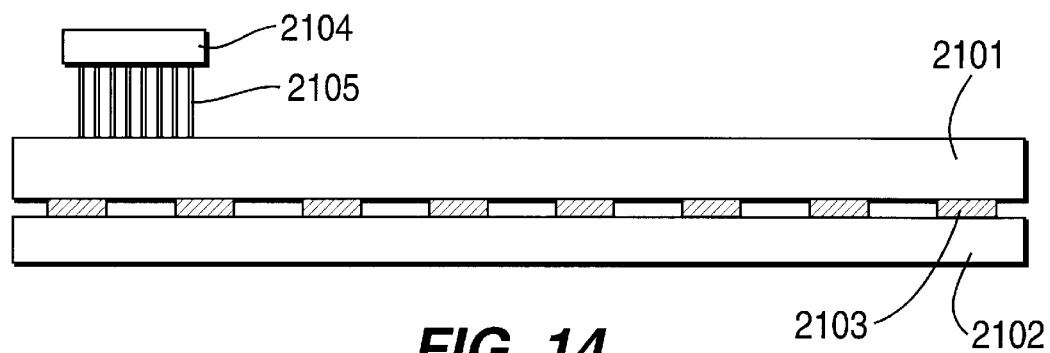
FIG. 14 is a side view of an exemplary video tile in which the electronics have been raised from the surface to improve heat dissipation and alleviate hot spots in the display.
Figure 15:
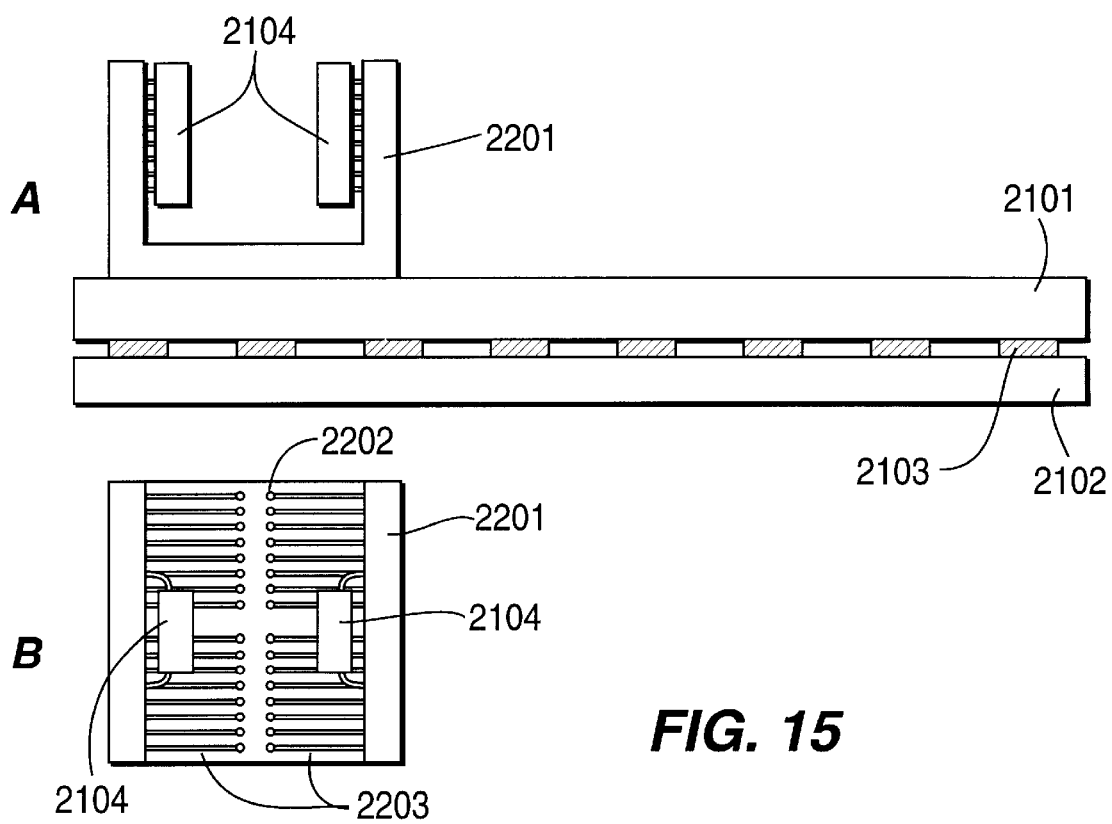
FIG. 15A is a side view of an exemplary video tile utilizing a fin structure to improve heat dissipation and alleviate hot spots in the display.
FIG. 15B is a top view of the fin structure in FIG. 15A.
Figure 16:
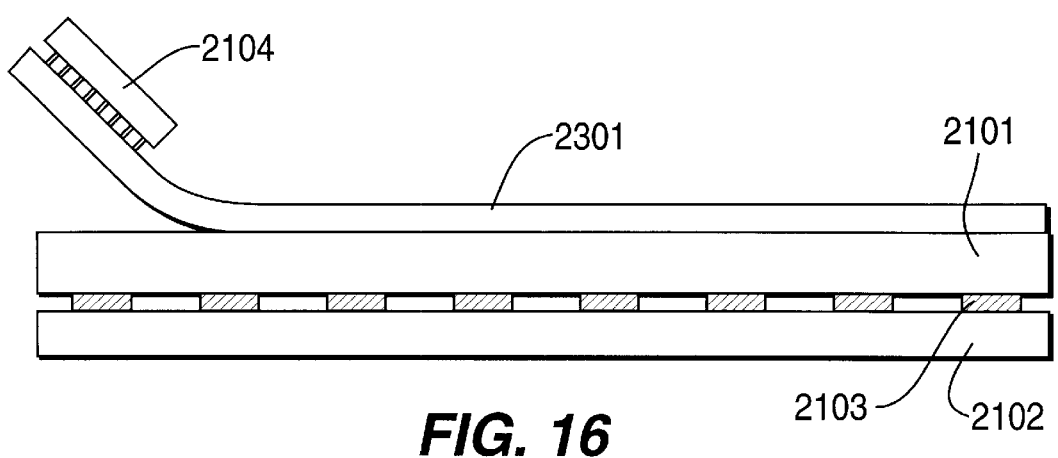
FIG. 16 is a side view of an exemplary video tile utilizing a flexible circuit board to improve heat dissipation and alleviate hot spots in the display.

FIGS. 14 through 16 illustrate exemplary methods to improve the thermal management of video tiles. Thermal management is an issue because the output intensity of many display materials is thermally sensitive. Electronic components on the circuit board may generate heat during operation of the video tile. When this heat cannot be dissipated, the tile may become warm which may lead to changes in the output characteristics of the tile. If the tile conducts heat well, this may not be a serious problem. With general heating of this sort it may be possible to compensate for the heating, or if all tiles heat evenly, the changes may go unnoticed. A greater issue is when the circuit board is a poor conductor of heat and the individual electronic components cause hot spots in the display, small regions that are significantly hotter than surrounding sections of the tile. Though the issue of hot spots is greater in tiles constructed directly on circuit boards with poor thermal conductivity, it is peculiar to tiles of this construction. In some cases the hot spots small enough in magnitude and extent to be compensated. In other cases compensation may be difficult and steps to avoid these hot spots are desirable.

FIG. 14 is a side view of an exemplary video tile fabricated on a single substrate 2101. In this embodiment, pixel structures 2103 are sandwiched between one side of the substrate and a transparent front panel 2102. On the other side of the substrate, electronics 2104 are coupled to the substrate by exceptionally long leads 2105. By coupling the electronics to the substrate with such long leads, this embodiment of the present invention reduces heat transfer from the electronics to the substrate thereby avoiding hot spots in the substrate which may affect the performance of pixels beneath the hot spots.

FIG. 15A demonstrates another exemplary embodiment of the present invention which may be used to avoid hot spots in the substrate surface. In FIG. 15A the substrate 2101 once again has pixels 2103 sandwiched between the substrate and the transparent front panel 2102. In this embodiment, the electronics 2104 are separated from the surface of the substrate by a fin structure 2201 which is mounted directly on the substrate.

FIG. 15B shows a top view of this fin structure 2201 including the electronics 2104 which have been mounted onto the fin structure. Also in this view can be seen the conductive traces 203 and the via 2202 which are used to electrically couple the fin structure to the substrate. The fin structure itself works as a heat sink to dissipate heat, thereby preventing formation of hot spots in the substrate ensuring more uniform performance of the video tile.

FIG. 16 demonstrates another exemplary embodiment of the present invention in which the single substrate 2101, transparent front panel 2102 and pixels 2103 have the same functions as in the previous two embodiments which were illustrated in FIGS. 14 and 15A. In this embodiment of the present invention, a flexible circuit board 2301 has been connected to the back of the single substrate. One end of the flexible circuit board 2302 has been bent away from the surface of the substrate. On this portion of the flexible circuit board, the electronics 2104 are mounted. This is done once again to alleviate hot spots in the substrate.

Although the embodiments of the invention described above have been in terms of an OLED display device, it is contemplated that similar concepts may be practiced with other types of display tiles. Also, it will be understood to one skilled in the art that a number of other modifications exist which do not deviate from the scope of the present invention as defined by the appended claims.

What is claimed:

1. An electronic display structure comprising;

a substrate having a top surface and a bottom surface;

the bottom surface of the substrate being a circuit board onto which circuitry for providing a plurality of electrical signals is coupled;

a picture element (pixel) structure having a predetermined area including:

a first electrode, formed on the top surface of the substrate;

a display material having a bottom surface and a top surface, the bottom surface being in close proximity to the first electrode; and a second electrode, positioned in close proximity to the top surface of the display material;

a first connecting via extending from the bottom surface of the substrate to couple the first electrode to receive a first electrical signal of the plurality of electrical signals; and a second connecting via extending from the bottom surface of the substrate and through the pixel structure to couple the second electrode to receive a second electrical signal of the plurality of electrical signals, wherein the first electrode and the display material are sized and arranged such that the second connecting via does not interfere with the first electrode or the display material.

2. The electronic display structure of claim 1, wherein the substrate comprises a ceramic material.

3. The electronic display structure of claim 2, wherein the ceramic material comprises worked alumina.

4. The electronic display structure of claim 1, wherein the substrate comprises a low-temperature co-fired ceramic and metal structure.

5. The electronic display structure of claim 1, wherein the display material comprises materials that form an organic light emitting diode.

6. An electronic display structure comprising;
a substrate having a top surface and a bottom surface;
a plurality of pixel structures, coupled to the top surface of the substrate, arranged in a matrix having rows and columns, and including a plurality of contacts corresponding to the rows and columns of the matrix for receiving electrical signals;
wherein each pixel structure includes a distinct portion of display material physically separated from the display material of any other pixel structure;
pixel driving circuitry coupled to the bottom surface of the substrate and adapted to provide a plurality of electrical signals which activate ones of the plurality of pixel structures in respective rows and columns of the matrix of pixel structures;
a plurality of electrical contacts coupled to receive the plurality of electrical signals provided by the pixel driving circuitry, the plurality of electrical contacts having at least a one-to-one correspondence with the plurality of contacts of the matrix of pixel structures; and
a plurality of vias for coupling the plurality of electrical contacts to the plurality of contacts of the matrix of pixel structures.

7. The electronic display structure of claim 6, further comprising timing circuitry, coupled to the bottom surface of the substrate and responsive to a timing signal to sequentially scan the pixel driving circuitry to provide electrical signals to successive rows of the matrix of pixel structures.

8. The electronic display structure of claim 7, further comprising a memory coupled to the bottom surface of the substrate, the memory storing image data to be provided to the driving circuitry.

9. The electronic display structure of claim 7, further comprising means for coupling at least one element of the pixel driving circuitry and the timing circuitry to the substrate in a manner that tends to avoid hot spots in the substrate.

10. The electronic display structure of claim 9, wherein;
the at least one element is implemented as an integrated circuit (IC); and
the means for coupling comprises a plurality of long leads of the IC electrically coupling the IC to the substrate such that the long leads of the IC are in contact with the substrate to the substantial exclusion of any other part of the IC.

11. The electronic display structure of claim 9, wherein;
the means for coupling the at least one element comprises a heat fin structure coupled to the bottom surface of the substrate which couples the at least one element to the substrate such that the at least one element is not in contact with substrate.

12. The electronic display structure of claim 9, wherein;
the means for coupling the at least one element comprises a flexible circuit board coupled to the bottom surface of the substrate and formed so that a portion of the flexible circuit board extends away from the bottom surface of the substrate; and
means for coupling the at least one element to the portion of the flexible circuit board such that the at least one element is not in contact with substrate.

13. The electronic display structure of claim 6, wherein the distinct portion of display material comprises a distinct portion of organic materials that form a light emitting diode.

14. A tiled display structure comprising a plurality of image tiles, each tile comprising;

a substrate having a top surface and a bottom surface;
a plurality of pixel structures, coupled to the top surface of the substrate, arranged in a matrix having rows and columns and including a plurality of contacts for receiving electrical signals;
wherein each pixel structure includes a distinct portion of display material physically separated from the display material of any other pixel structure;
pixel driving circuitry coupled to the bottom surface of the substrate and adapted to provide a plurality of electrical signals which are conditioned to activate respective ones of the plurality of pixel structures;
a plurality of electrical contacts coupled to receive the plurality of electrical signals provided by the pixel driving circuitry, the plurality of electrical contacts having at least a one-to-one correspondence with the plurality of contacts of the matrix of pixel structures; and
a plurality of vias for coupling the plurality of electrical contacts to the plurality of contacts of the matrix of pixel structures;
a rigid back panel and frame structure including a plurality of spring elements which hold the plurality of image tiles in position to form the tiled display structure; and
a plurality of flexible connections which provide operational power to the plurality of image tiles.

15. The electronic display structure of claim 14, further comprising auxiliary circuitry including at least one of;
a memory coupled to the bottom surface of the substrate, the memory storing image data to be provided to the driving circuitry; and
timing circuitry, coupled to the bottom surface of the substrate and responsive to a timing signal to sequentially scan the pixel driving circuitry to provide electrical signals to successive rows of the matrix of pixel structures.

16. The electronic display structure of claim 14, wherein the distinct portion of display material comprises a distinct portion of organic light emitting diode material.

17. A tiled display structure comprising a plurality of image tiles, each tile comprising;
a substrate having a top surface and a bottom surface;
a display section coupled to the top surface of the substrate, including a glass substrate and a plurality of pixel structures, each pixel structure defining a pixel area and having an active region which occupies a portion of the pixel area, the plurality of pixel structures being arranged in a matrix having rows and columns and including a plurality of contacts for receiving electrical signals;
pixel driving circuitry coupled to the bottom surface of the substrate and adapted to provide a plurality of electrical signals to respective ones of the electrical contacts of the pixel structures to selectively activate the plurality of pixel structures;
a transparent front panel having a plurality of rows and columns of dark-colored lines, the plurality of lines being substantially equal in width and defining transparent regions on the front panel for pixel positions in the tiled display device; and
means for securing the glass substrate of the display sections of the plurality of tiles to the transparent front panel to align the active region of each pixel area on each tile with a respectively different one of the defined transparent regions on the front panel.

18. A tiled display structure comprising a plurality of image tiles, each tile comprising;
   a substrate having a top surface and a bottom surface;
   a display section coupled to the top surface of the substrate, including a glass substrate having a front surface and a back surface, the display section further including a plurality of pixel structures, coupled to the back surface of the glass substrate, each pixel structure defining a pixel area and having an active region which occupies a portion of the pixel area, the plurality of pixel structures being arranged in a matrix having rows and columns and including a plurality of contacts for receiving electrical signals, wherein the front surface of the glass substrate includes a plurality of dark-colored lines having a predetermined width which form a black matrix surrounding the active regions of the plurality of pixel structures; and
   pixel driving circuit coupled to the bottom surface of the substrate and adapted to provide a plurality of electrical signals to respective ones of the electrical contacts of the pixel structures to selectively activate the plurality of pixel structures.

19. The tiled display structure of claim 18, further comprising a plurality of mullions each of which joins the glass substrate of one of the image tiles to the glass substrate of another one of the image tiles, the mullions having a "T" shaped cross section which defines a crossbar and a stem, the crossbar having a width substantially equal to the predetermined width, wherein the plurality of mullions join the plurality of tiles to form the tiled display structure.

20. A method of constructing an electronic display structure on a substrate having a top surface and a bottom surface comprising the steps of;
   forming a plurality of vias extending from the bottom surface of the substrate to the top surface of the substrate;
   forming a circuit board structure on the bottom surface of the substrate, the circuit board structure including a plurality of electrical contacts coupled to the plurality of vias;
   mounting pixel driving circuitry on the circuit board structure and coupling the driving circuitry to the plurality of vias to provide a plurality of electrical signals;
   forming a plurality of row electrodes on the top surface of the substrate;
   coupling each row electrode of the plurality of row electrodes to at least one of the vias to receive a respective row electrical signal of the plurality of electrical signals;
   forming a plurality of pixel regions each containing at least one distinct active pixel area, each distinct active pixel area composed of at least one layer of display material, wherein at least one of the distinct active pixel areas is on top of each row electrode;
   forming a plurality of transparent column electrodes over the distinct active pixel areas, wherein each distinct active pixel area is coupled to one transparent column electrode of the plurality of transparent column electrodes; and
   coupling each transparent column electrode of the plurality of transparent column electrodes to at least one of the vias to receive a respective column electrical sign of the plurality of electrical signals.

21. The method of claim 20, wherein the plurality of row electrodes and the plurality of active pixel areas are sized and arranged such that the at least one via coupled to the at least one transparent column electrode of the plurality of transparent column electrodes does not interfere with the plurality of row electrodes or the plurality of distinct active pixel areas.

22. The method of claim 20, wherein the substrate comprises alumina.

23. The method of claim 22, wherein the step of forming a plurality of vias extending from the bottom surface of the substrate to the top surface of the substrate comprises the steps of;
   coating the top surface of the alumina substrate with a planarization layer;
   working a plurality of holes in the coated alumina substrate extending from the bottom surface of coated alumina substrate through the planarization layer; and
   forming a conductor in each of the plurality of holes coupled to the bottom surface of the coated substrate and the planarization layer.

24. The method of claim 23, wherein the planarization layer comprises spin-on-glass.

25. The method of claim 20, wherein the substrate is comprised of a low-temperature co-fired ceramic and metal structure.

26. The method of claim 20, wherein the plurality of pixel regions are of substantially equal size and arranged in a matrix having a plurality of rows and a plurality of columns such that the matrix covers substantially all of the top surface of the substrate.

27. A method of constricting a electronic display tile including a substrate having a top surface, a bottom surface, a pair of horizontal edges, and a pair of vertical edges, the top surface of each substrate being covered by a plurality of pixel regions arranged in a matrix of rows and columns, comprising the steps of;
   forming a plurality of vias extending from the bottom surface of the substrate to the top surface of the substrate;
   forming a circuit board structure on the bottom surface of the substrate, the circuit board structure including a plurality of electrical contacts coupled to the plurality of vias;
   forming a plurality of row electrodes on the top surface of the substrate;
   coupling each row electrode of the plurality of row electrodes to at least one of the vias to receive a respective row electrical signal of the plurality of electrical signals;
   forming at least one distinct active pixel area in each of the plurality of pixel regions, wherein the distinct active pixel area includes at least one layer of display material and is coupled to one row electrode of the plurality of row electrodes;
   forming a plurality of transparent column electrodes over the plurality of distinct active pixel areas, wherein each distinct active pixel area is coupled to one transparent column electrode of the plurality of transparent column electrodes; and
   coupling each transparent column electrode of the plurality of transparent column electrodes to at least one of the vias to receive a respective column electrical signal of the plurality of electrical signals.

28. The method of claim 27, wherein the plurality of row electrodes and the plurality of distinct active pixel areas are sized and arranged such that the at least one via coupled to the plurality of transparent column electrodes does not interfere with the plurality of row electrodes or the plurality of distinct active pixel areas.

29. The method of claim 27, wherein the top surface of each substrate is substantially completely covered by the plurality of pixel regions.

30. The method of claim 29, further comprising the step of;
    machining the pair of horizontal edges of the substrate with a pair of complementary horizontal edge patterns arranged such that the pair of complimentary horizontal edge patterns do not interfere with the plurality of distinct active pixel areas;
    whereby adjacent tiles in a tiled display system may be precisely aligned horizontally.

31. The method of claim 29, further comprising the step of;
    machining the pair of vertical edges of the substrate with a pair of complementary vertical edge patterns arranged such that the pair of complimentary vertical edge patterns do not interfere with the plurality of distinct active pixel areas;
    whereby adjacent tiles in a tiled display system may be precisely aligned vertically.

32. The method of claim 27, wherein the at least one layer of display material comprises at least one layer of an organic light emitting diode material.

33. A tiled display structure comprising a plurality of image tiles, each tile comprising;
    a glass substrate having a front surface and a back surface;
    a display section coupled to the back surface of the glass substrate, including a plurality of pixel structures, each pixel structure defining a pixel area and having an active region which occupies a portion of the pixel area, the plurality of pixel structures being arranged in a matrix having rows and columns and including a plurality of contacts for receiving electrical signals;
    a passivation layer which covers each pixel structure in the display section and does not cover the plurality of contacts; and
    pixel driving circuitry coupled to the back surface of the glass substrate and arranged so as not to interfere with the active regions of the pixel structures, the pixel driving circuitry adapted to provide a plurality of electrical signals to respective ones of the electrical contacts of the pixel structures to selectively activate the plurality of pixel structures.

34. The tiled display structure of claim 33, further comprising a plurality of dark-colored lines coupled to the front surface of the glass substrate forming a black matrix surrounding the active regions of the plurality of pixel structures, each line having a predetermined width, the predetermined width being less than a maximum width at wich a substantial amount of light from the plurality of pixel structures is blocked by the plurality of dark-colored lines and greater than a minimum width at which the pixel driving circuitry is substantially visible through the front surface of the glass substrate.

35. The tiled display structure of claim 33, further comprising a plurality of dark-colored lines coupled to the back surface of the glass substrate forming a black matrix surrounding the active regions of the plurality of pixel structures, the plurality of dark-colored lines disposed between the glass substrate and the pixel driving circuitry.

36. The tiled display structure of claim 33, wherein the passivation layer is disposed between the display section and the pixel driving circuitry.

37. The tiled display structure of claim 36, wherein the passivation layer is formed of a dark-colored material and extends over substantially all of the back surface of the glass substrate.

38. The tiled display structure of claim 33, wherein the pixel driving circuitry is coupled to the back surface of the glass substrate by at least one of;
    a plurality of solder bumps;
    a plurality of flip chip connectors;
    a plurality of long leads in contact with the display section to the substantial exclusion of any other part Of the pixel driving circuitry.

39. The tiled display structure of claim 33, wherein;
    the portion of each pixel area occupied by the corresponding active region is less than one half of the pixel area; and
    each pixel area adjacent to the at least one edge has a pixel area that is less than the pixel area of a pixel that is distant from the edge.

40. A tiled display structure having a plurality of display tiles comprising;
    a substrate having at least one edge; and
    a plurality of active pixel areas, each pixel area including a discrete portion of display material, the active pixel areas being arranged on the substrate in a matrix of rows and columns, each active pixel area substantially isolated, electrically and optically, from remaining active pixel areas and physically separated from an adjacent active pixel area by a determined distance;
    wherein active pixel areas nearest to the at least one edge have a separation from the at least one edge that is less than the predetermined distance;
    whereby, when the plurality of image tiles are fit together, the active pixel areas nearest to the at least one edge of one image tile are separated from an adjacent active pixel area of an adjacent image tile by the predetermined distance.

41. The tiled display structure of claim 40, wherein the plurality of active pixel areas include a plurality of sub-pixels.

* * * * *